US012684753B2

(12) United States Patent
Matsuzaki et al.

(10) Patent No.: US 12,684,753 B2
(45) Date of Patent: Jul. 14, 2026

(54) MEMORY DEVICE

(71) Applicant: Semiconductor Energy Laboratory Co., Ltd., Atsugi (JP)

(72) Inventors: Takanori Matsuzaki, Atsugi (JP); Hiroki Inoue, Atsugi (JP); Yuki Okamoto, Ebina (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/382,075

(22) Filed: Oct. 20, 2023

(65) Prior Publication Data

US 2024/0147687 A1 May 2, 2024

(30) Foreign Application Priority Data

Oct. 28, 2022 (JP) ................................. 2022-172931

(51) Int. Cl.
*H10B 12/00* (2023.01)
(52) U.S. Cl.
CPC ..................................... *H10B 12/00* (2023.02)
(58) Field of Classification Search
CPC ........ H10D 84/0165–0195; H10D 84/85–859;
H10D 84/907–994; H10D 84/0193; H10D
84/853; H10D 30/673; H10D 30/689;
H10D 30/0323; H10D 30/6713; H10D
30/6744; H10D 30/6757; H10D 62/021;
H10D 64/015; H10D 64/021; H10D
62/151; H10D 62/364; H10D 64/017;
H10D 30/797;

(Continued)

(56) References Cited

U.S. PATENT DOCUMENTS

| 8,455,868 B2 | 6/2013 | Yamazaki et al. |
| 9,312,257 B2 | 4/2016 | Yamazaki et al. |

(Continued)

FOREIGN PATENT DOCUMENTS

| JP | 2011-151383 A | 8/2011 |
| JP | 2013-211537 A | 10/2013 |
| WO | WO-2021/053473 | 3/2021 |

OTHER PUBLICATIONS

Huang.K et al., "Vertical Channel-All-Around (CAA) IGZO FET under 50 nm CD with High Read Current of 32.8 μA/μm (Vth+1V), Well-performed Thermal Stability up to 120° C. for Low Latency, High-density 2TOC 3D DRAM Application", 2022 Symposium on VLSI Technology and Circuits Digest of Technical Papers, Jun. 12, 2022, pp. 296-297.

(Continued)

*Primary Examiner* — Moin M Rahman
(74) *Attorney, Agent, or Firm* — Eric J. Robinson; Robinson Intellectual Property Law Office, P.C.

(57) ABSTRACT

A memory device that can be highly integrated is provided. The memory device includes a first transistor and a second transistor in a memory cell, and small-area vertical transistors each including a channel formation region on a side surface of an opening portion provided in an insulating layer are used as the two transistors. The memory cell includes a conductor having a function of a gate electrode of the first transistor and a function of one of a source electrode and a drain electrode of the second transistor. The memory cells are placed in a staggered arrangement, so that the memory device can be highly integrated.

19 Claims, 14 Drawing Sheets

(58) Field of Classification Search
CPC ....... H10D 64/671; H10D 30/62–6219; H10D
30/024–0245; H10D 84/0158; H10D
86/011; H10D 84/834; H10D 86/215;
H10D 30/60–798; H10D 30/021–0415;
H10D 84/83–859; H10D 84/0128; H10D
84/0167; H10D 62/85–854; H10D
30/751; H10D 30/027–0278; H10D
30/63; H10D 84/016; H10D 30/501–509;
H10D 84/014; H10D 84/0177; H10D
84/038; H10D 30/6215; H10D 30/0217;
H10D 30/6728; H10D 30/6755; H10D
88/00; H10D 84/0195; B81C 2203/0728;
B81C 2203/0735; B81C 2203/0742;
H01L 21/31116; H01L 21/30604; H01L
21/3065; H01L 21/02068; H01L
21/32134; H01L 21/32136; H01L
21/32137; H01L 21/3213; H01L 21/0228;
H10B 12/36; H10B 12/056; H10B 63/34;
H10B 12/00; H10B 12/01; H10B 41/70;
G11C 11/405

See application file for complete search history.

(56) References Cited

U.S. PATENT DOCUMENTS

| | | | | |
|---|---|---|---|---|
| 9,349,735 | B2 | 5/2016 | Yamazaki et al. | |
| 9,748,273 | B2 | 8/2017 | Yamazaki et al. | |
| 9,991,265 | B2 | 6/2018 | Yamazaki et al. | |
| 10,038,011 | B2 | 7/2018 | Yamazaki et al. | |
| 10,418,381 | B2 | 9/2019 | Yamazaki et al. | |
| 10,553,589 | B2 | 2/2020 | Yamazaki et al. | |
| 10,685,984 | B2 | 6/2020 | Yamazaki et al. | |
| 11,133,330 | B2 | 9/2021 | Yamazaki et al. | |
| 11,456,296 | B2 | 9/2022 | Yamazaki et al. | |
| 11,825,665 | B2 | 11/2023 | Yamazaki et al. | |
| 2018/0033807 | A1 * | 2/2018 | Matsuda | H10D 30/6755 |
| 2022/0352384 | A1 | 11/2022 | Oota et al. | |
| 2023/0387130 | A1 | 11/2023 | Yamazaki et al. | |
| 2023/0395609 | A1 | 12/2023 | Yamazaki et al. | |
| 2023/0413587 | A1 | 12/2023 | Yamazaki et al. | |

OTHER PUBLICATIONS

Oota.M et al., "3D-Stacked CAAC-In-Ga-Zn Oxide FETs with Gate Length of 72nm", IEDM 19: Technical Digest of International Electron Devices Meeting, Dec. 7, 2019, pp. 50-53.

* cited by examiner

210(WWL)

240(WBL)

310

140(RBL)

110(RWL)

41

150

Z
X   Y

210(WWL)

320

310

240(WBL)

41

110(RWL)   150   140(RBL)

Z
X   Y

FIG. 12A
6500
6509
6505 6507
6501
6508
6502
6503
6506
6504
FIG. 12B
6600
6611
6615
6612
6613
6614
6616
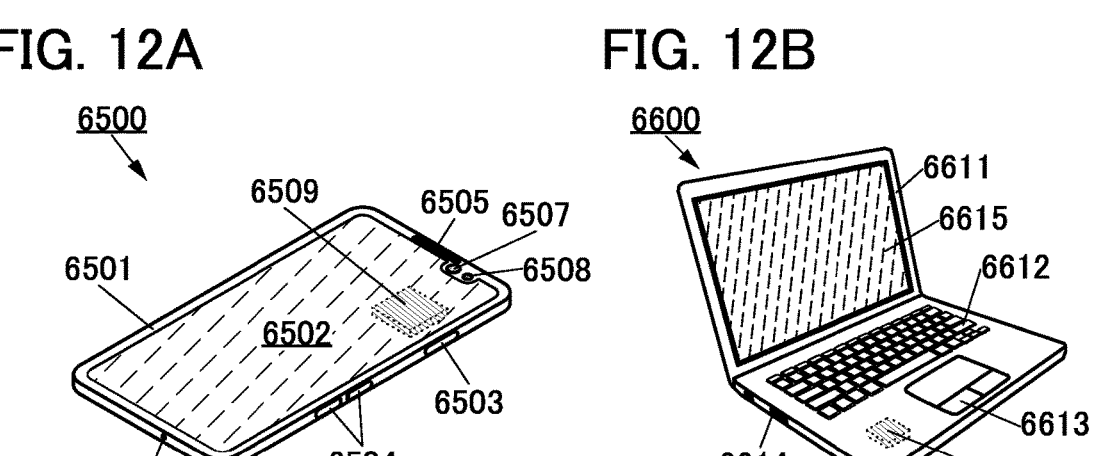
FIG. 12C
5610
5600
5620
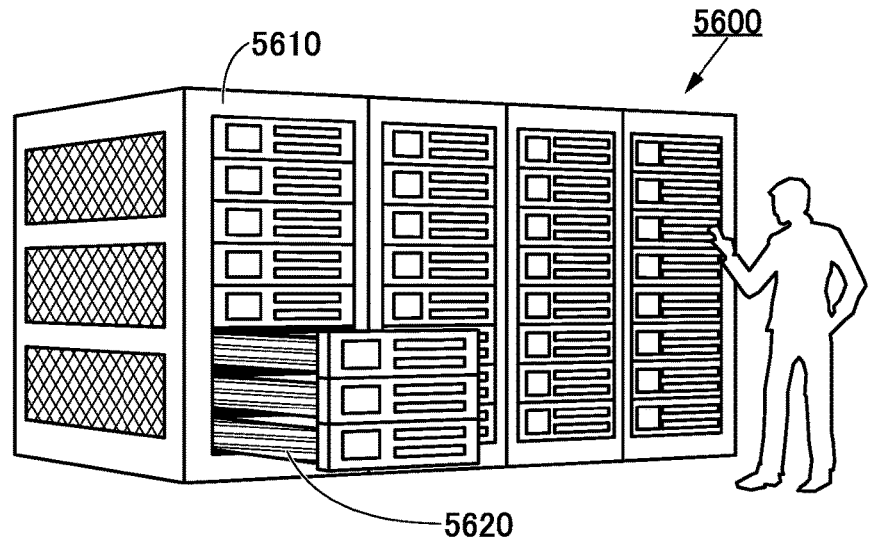
FIG. 12D
5620
5621
5625
5630
5631
5624
5623
FIG. 12E
5621
5625
5622
5626
5627
5628
5624
5629
5623

MEMORY DEVICE

BACKGROUND OF THE INVENTION

1. Field of the Invention

One embodiment of the present invention relates to a transistor, a semiconductor device, a memory device, and an electronic device. Another embodiment of the present invention relates to a memory device or a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like are sometimes regarded as including a semiconductor device.

One embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

2. Description of the Related Art

A semiconductor circuit (IC chip) of an LSI, a CPU, a memory, or the like is mounted on a printed circuit board or the like to be used as one of components of a variety of electronic devices. A technique of forming a transistor using a semiconductor thin film has attracted attention. The transistor is practically used in an electronic device such as an image display device (also simply referred to as a display device) and is expected to be used in the semiconductor circuit as well.

A silicon-based semiconductor material is widely known as a material of a semiconductor thin film that can be used in a transistor. As another material, an oxide semiconductor has been attracting attention. It is known that the current flowing through a transistor including an oxide semiconductor in the non-conducting state (off state) is extremely low.

For example, Patent Document 1 discloses a memory device that can retain stored data for a long time by utilizing a characteristic of a low leakage current of the transistor including an oxide semiconductor.

In recent years, demand for an integrated circuit with higher density has risen with reductions in size and weight of electronic devices. In addition, the productivity of a semiconductor device including an integrated circuit is desired to be improved. For example, Patent Document 2 and Non-Patent Document 1 disclose a technique to achieve an integrated circuit with higher density by making a plurality of memory cells overlap with each other by stacking a first transistor including an oxide semiconductor film and a second transistor including an oxide semiconductor film.

Furthermore, by employing vertical transistors, an integrated circuit with higher density can be achieved. For example, Patent Document 3 discloses a vertical transistor in which a side surface of an oxide semiconductor is covered with a gate electrode with a gate insulator therebetween.

REFERENCES

Patent Documents

[Patent Document 1] Japanese Published Patent Application No. 2011-151383

[Patent Document 2] PCT International Publication No. 2021/053473

[Patent Document 3] Japanese Published Patent Application No. 2013-211537

Non-Patent Document

[Non-Patent Document 1] M. Oota, et al., "3D-Stacked CAAC—In—Ga—Zn Oxide FETs with Gate Length of 72 nm", IEDM Tech. Dig., 2019, pp. 50-53

SUMMARY OF THE INVENTION

The memory cell disclosed in Patent Document 1 includes a write transistor and a read transistor, where a current flows through the read transistor in accordance with the potential of data retained in a gate of the read transistor to change the potential of a bit line (a read line).

In the memory cell, unlike in a DRAM cell, there is no need to provide a capacitor with a large volume, which enables formation of a memory device (memory) with a high integration degree. By appropriately disposing elements of memory cells two-dimensionally or three-dimensionally, the integration degree can be further increased, so that a memory device (memory) with a high storage capacity can be formed.

An object of one embodiment of the present invention is to provide a memory device that can be highly integrated. Another object is to provide a memory device with favorable electrical characteristics. Another object is to provide a highly reliable memory device. Another object is to provide a memory device with low power consumption. Another object is to provide a novel memory device. Another object is to provide a novel semiconductor device or the like.

Note that the description of these objects does not preclude the existence of other objects. In one embodiment of the present invention, there is no need to achieve all these objects. Other objects will be apparent from and can be derived from the description of the specification, the drawings, the claims, and the like.

One embodiment of the present invention is a memory device including a plurality of memory cells placed in a staggered arrangement, a first wiring, a second wiring, a third wiring, and a fourth wiring. In the memory device, each of the plurality of memory cells includes a first transistor and a second transistor. The second transistor is positioned above the first transistor. The first transistor includes a first semiconductor including a region formed on a side surface of a first opening portion penetrating through the third wiring and a first insulator, a second insulator being in contact with the first semiconductor and covering the first opening portion, and a first conductor being in contact with the second insulator and embedded in the first opening portion. The first semiconductor includes a region being in contact with the second wiring at a bottom portion of the first opening portion. The second transistor includes a second semiconductor including a region formed on a side surface of a second opening portion penetrating through the fourth wiring and a third insulator, a fourth insulator being in contact with the second semiconductor and covering the second opening portion, and a second conductor being in contact with the fourth insulator and embedded in the second opening portion. The second semiconductor includes a region being in contact with the first conductor at a bottom portion of the second opening portion. The first wiring is positioned over the second conductor so as to overlap with the second conductor. When a diameter of a smallest circle including a shape in a top view of the first opening portion is D1 and a diameter of a smallest circle including a shape in a top view of the first conductor is D2, a width of the second wiring is greater than or equal to D1 and less than or equal to D2. A width of the third wiring and a width of the fourth wiring are each greater than D2 and less than or equal to $2 \times D2$.

In the memory cells, it is preferable that a width of the first wiring and the width of the second wiring be substantially the same as each other and that the first wiring and the second wiring be substantially parallel with each other and overlap with each other.

In the memory cells, it is preferable that the width of the third wiring and the width of the fourth wiring be substantially the same as each other and that the third wiring and the fourth wiring be substantially parallel with each other and overlap with each other.

It is preferable that the first wiring and the second wiring be substantially orthogonal to the third wiring and the fourth wiring.

The second wiring can include a region functioning as one of a source electrode and a drain electrode of the first transistor, the third wiring can include a region functioning as the other of the source electrode and the drain electrode of the first transistor, the first conductor can have a function of a gate electrode of the first transistor and a function of one of a source electrode and a drain electrode of the second transistor, and the fourth wiring can include a region functioning as the other of the source electrode and the drain electrode of the second transistor.

It is preferable that a diameter of the first opening portion and a diameter of the second opening portion be substantially the same as each other and that the first opening portion and the second opening portion overlap with each other.

It is preferable that the plurality of memory cells be placed in a staggered arrangement in two columns in a longitudinal direction of the third wiring and the fourth wiring.

It is preferable that a channel length is smaller than a channel width in each of the first transistor and the second transistor.

In the above-described memory device, it is preferable that each of the first semiconductor and the second semiconductor be an oxide semiconductor and that the oxide semiconductor include one or more selected form In, Ga, and Zn.

With one embodiment of the present invention, a memory device that can be highly integrated can be provided. A memory device with favorable electrical characteristics can be provided. A highly reliable memory device can be provided. A memory device with low power consumption can be provided. A novel memory device can be provided. A novel semiconductor device or the like can be provided.

Note that the description of these effects does not preclude the existence of other effects. One embodiment of the present invention does not necessarily achieve all these effects. Other effects will be apparent from and can be derived from the description of the specification, the drawings, the claims, and the like.

BRIEF DESCRIPTION OF THE DRAWINGS

In the accompanying drawings:

FIGS. 12A and 12B illustrate examples of electronic devices and FIGS. 12C to 12E illustrate an example of a large computer;

DETAILED DESCRIPTION OF THE INVENTION

Figure 1:
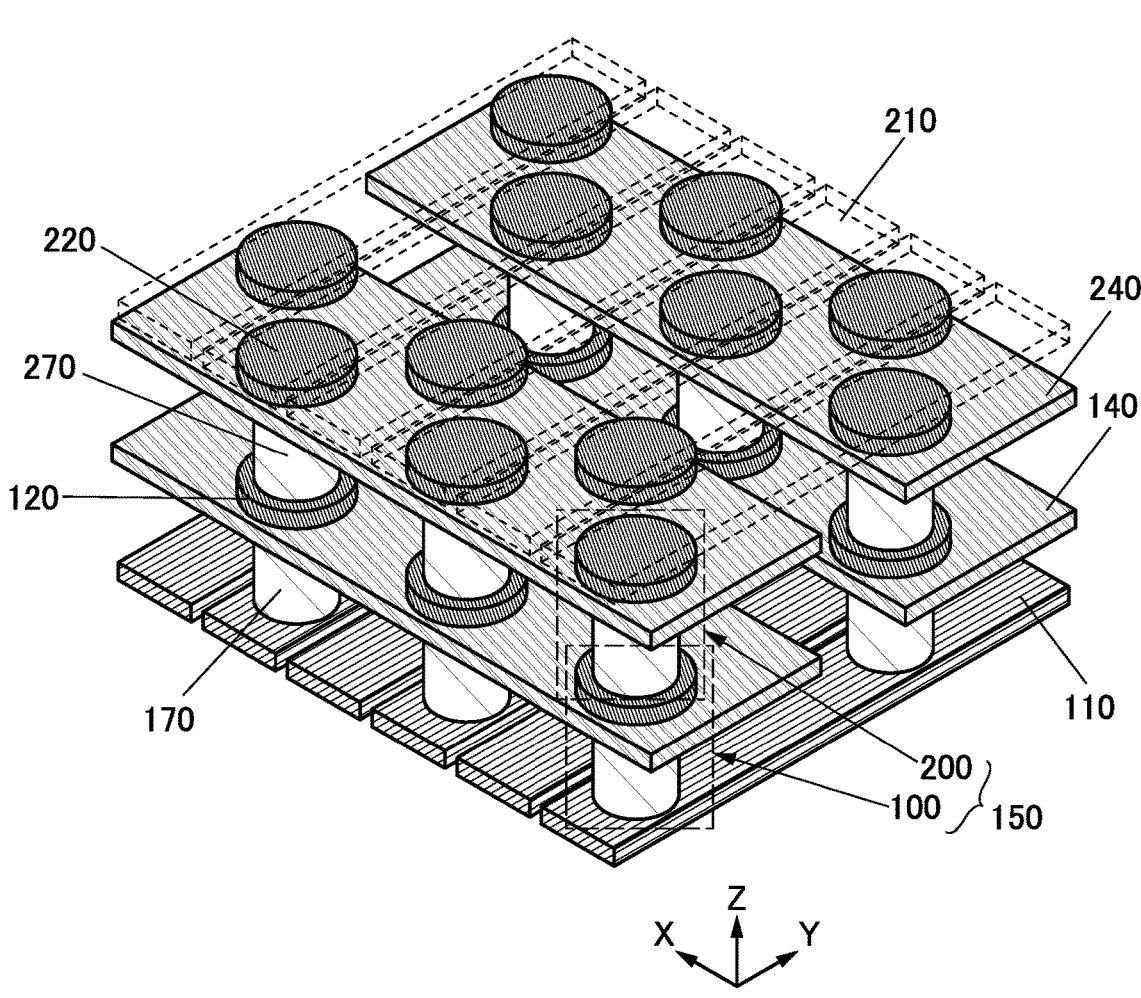
FIG. 1 illustrates a memory device.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the same portions or portions having similar functions are denoted by the same reference numerals in different drawings, and explanation thereof will not be repeated in some cases. The same hatching pattern is used for portions having similar functions, and the portions are not denoted by specific reference numerals in some cases.

Note that in this specification and the like, an oxynitride is a material that contains more oxygen than nitrogen in its composition. Examples of the oxynitride include silicon oxynitride, aluminum oxynitride, and hafnium oxynitride. A nitride oxide is a material that contains more nitrogen than oxygen in its composition.

Examples of the nitride oxide include silicon nitride oxide, aluminum nitride oxide, and hafnium nitride oxide.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°. The term "orthogonal" indicates that two straight lines intersect with or are connected to each other so that the angle formed between the lines is greater than or equal to 80° and less than or equal to 100°. Thus, the case where the angle is greater than or equal to 85° and less than or equal to 95° is also included. The terms "approximately orthogonal" and "substantially orthogonal" indicate that two straight lines intersect with or are connected to each other so that the angle formed between the lines is greater than or equal to 60° and less than or equal to 120°.

In this specification and the like, terms for describing arrangement, such as "over", "above", "under", and "below", are used for convenience in describing a positional relationship between components with reference to drawings. The positional relationship between components is changed as appropriate in accordance with the direction from which each component is described. Thus, the positional relationship is not limited to that described with a term used in this specification and can be explained with other terms as appropriate depending on the situation.

Embodiment 1

In this embodiment, a memory device that is one embodiment of the present invention is described. The memory device that is one embodiment of the present invention includes a first transistor and a second transistor in a memory cell.

As the two transistors, vertical transistors each of which includes a channel formation region on a side surface of an opening portion provided in an insulating layer are used. The area occupied by the vertical transistors can be small in a top view. The vertical transistors can each have a short channel length and a long channel width and thus have an increased on-state current.

The memory cell includes a conductor having a function of a gate electrode of the first transistor and a function of one of a source electrode and a drain electrode of the second transistor. The conductor has a substantially circular top surface. In order to prevent the conductor from being in contact with the conductor of the adjacent memory cell, the memory cells are placed in a staggered arrangement. Thus, a memory device with a small memory cell size and a high integration degree can be provided.

In this specification and the like, the staggered arrangement refers to a regular arrangement where a plurality of components are alternately staggered one by one, for example. Alternatively, the staggered arrangement refers to an arrangement where a plurality of components are obliquely intermingled with each other. The staggered arrangement can be rephrased as a zigzag arrangement.

FIG. 1 is a perspective view illustrating part of the memory device of one embodiment of the present invention and illustrates a plurality of memory cells 150 (transistors 100 and 200) placed in a staggered arrangement. The transistors 100 and 200 are vertical transistors; the transistor 200 is provided above the transistor 100. The memory cell 150 is electrically connected to a wiring 110, a wiring 140, a wiring 240, and a wiring 210. For clarification, an insulator such as an interlayer film is not illustrated and the wiring 210 is illustrated with a dashed line.

The wiring 110 includes a region that functions as one of a source electrode and a drain electrode of the transistor 100. The wiring 140 includes a region that functions as the other of the source electrode and the drain electrode of the transistor 100.

A conductor 120 has a function of a gate electrode of the transistor 100 and a function of one of a source electrode and a drain electrode of the transistor 200. In other words, the conductor 120 includes a region shared by the gate electrode of the transistor 100 and the one of the source electrode and the drain electrode of the transistor 200.

A conductor 220 includes a region that functions as a gate electrode of the transistor 200 and is electrically connected to the wiring 210 formed over the conductor 220. The structures and connections of the transistors are described in detail later.

The memory cells 150 are placed in a staggered arrangement in two columns in a longitudinal direction of the wiring 140 and the wiring 240. The wiring 110 and the wiring 210 are substantially parallel with each other and overlap with each other. The wiring 140 and the wiring 240 are substantially parallel with each other and overlap with each other. With this structure, the cell area can be reduced, whereby a memory device with a high integration degree and a large storage capacity can be formed.

Figure 2A:
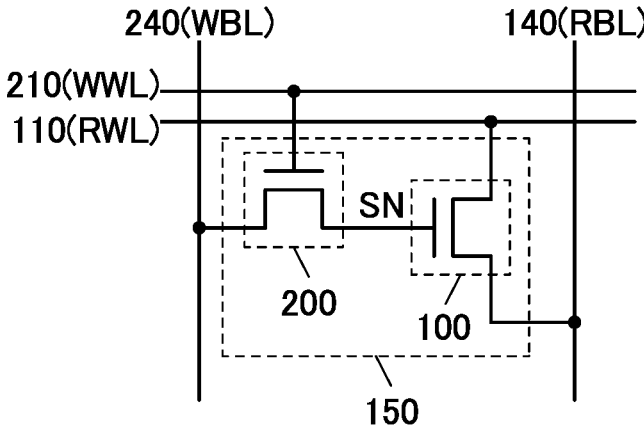
FIGS. 2A to 2C are circuit diagrams each illustrating a memory cell.

FIG. 2A illustrates an example of a circuit diagram of the memory cell 150.

The one of the source and the drain of the transistor 200 is connected to the gate of the transistor 100; this connection is established by the conductor 120 in FIG. 1. The conductor 120 can also be referred to as a component of a node SN that retains a data potential in the memory cell 150.

The wiring 210 connected to the gate of the transistor 200 is a wiring that supplies a write word signal to the memory cell 150 and also referred to as a write word line (WWL). The write word signal is a signal that controls the timing of data writing to the memory cell 150.

The wiring 240 connected to the other of the source and the drain of the transistor 200 is a wiring that supplies a potential corresponding to a data signal (data) to the memory cell 150 and also referred to as a write bit line (WBL). The data signal is a signal written to the memory cell 150 and represented by two values which are a high-level value ("1" or $V_H$) and a low-level value ("0" or $V_L$).

The wiring 110 connected to the one of the source and the drain of the transistor 100 is a wiring that supplies a read word signal to the memory cell 150 and also referred to as a read word line (RWL). The read word signal is a signal that controls the timing of data reading from the memory cell 150.

The wiring 140 connected to the other of the source and the drain of the transistor 100 is a wiring for reading a potential corresponding to a data signal (data) retained in the memory cell 150 and also referred to as a read bit line (RBL). A current flows through the transistor 100 in accordance with the data ("1" or "0") written to the memory cell 150, so that the potential of the wiring 140 changes from the precharged value. The potential is input to a sense amplifier, whereby data can be read.

Figure 2B:
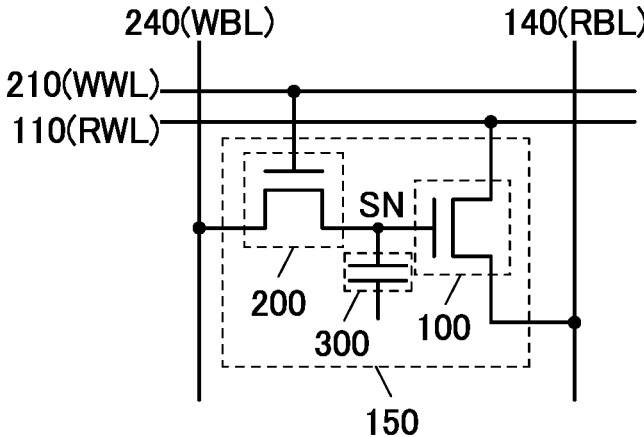

As illustrated in FIG. 2B, a capacitor 300, one electrode of which is connected to the one of the source and the drain of the transistor 200 and the gate of the transistor 100, may be provided. The other electrode of the capacitor 300 is connected to a wiring to which a fixed potential is supplied. The capacitor 300 serves as a data retention capacitor, whereby data retention capability can be enhanced. In some cases, the potential of the node SN varies by capacitive coupling caused by parasitic capacitance between the transistors and the wirings or the like. In the case where the capacitor 300 is provided, the potential variation in the node SN can be suppressed to be small and the reading accuracy can be increased.

Figure 2C:
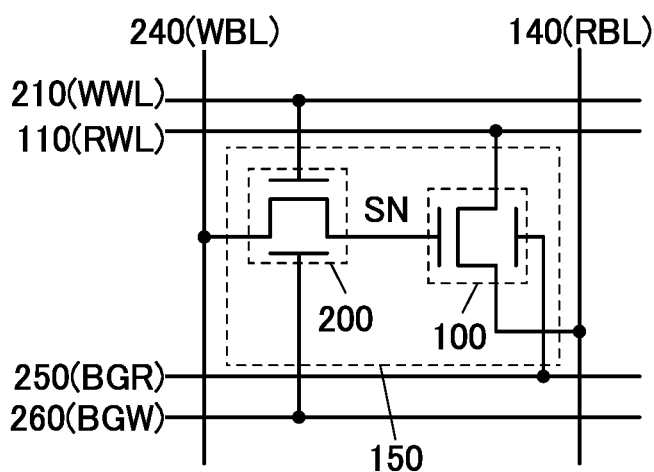

As illustrated in FIG. 2C, the transistor 100 may be provided with a back gate, and a wiring 250 connected to the back gate may be provided. The wiring 250 is also referred to as a control line (BGR) which supplies a signal that controls the threshold voltage of the transistor 100. The signal that controls the threshold voltage of the transistor 100 is a signal represented by two values which are a high-level value ($V_{BGRH}$) and a low-level value ($V_{BGRL}$).

When the signal that controls the threshold voltage of the transistor 100 is at the high level ($V_{BGRH}$), the threshold voltage of the transistor 100 shifts negatively and a current corresponding to the potential of the gate flows. Specifically, when the potential of the gate is the potential $V_H$, which is written to the memory cell 150, a current flows in accordance with the potential of the source. When the potential of the gate is the potential $V_L$, which is written to the memory cell 150, the potential of the gate is equal to the potential of the source and a current hardly flows. When the signal that controls the threshold voltage of the transistor 100 is at the low level ($V_{BGRL}$), the threshold voltage of the transistor 100 shifts positively and a current hardly flows regardless of the potential of the gate. Thus, by controlling the back gate potential of the transistor 100, a selection/non-selection operation of the memory cell can be performed, for example.

The transistor 200 may be provided with a back gate, and a wiring 260 connected to the back gate may be provided. The wiring 260 is also referred to as a control line (BGW) which supplies a signal that controls the threshold voltage of the transistor 200. With this structure, the threshold voltage of the transistor 200 shifts positively and the non-conducting state can be established more reliably. Thus, the performance of retaining charge in accordance with the potential of the data signal supplied to the node SN can be enhanced.

Figure 3:
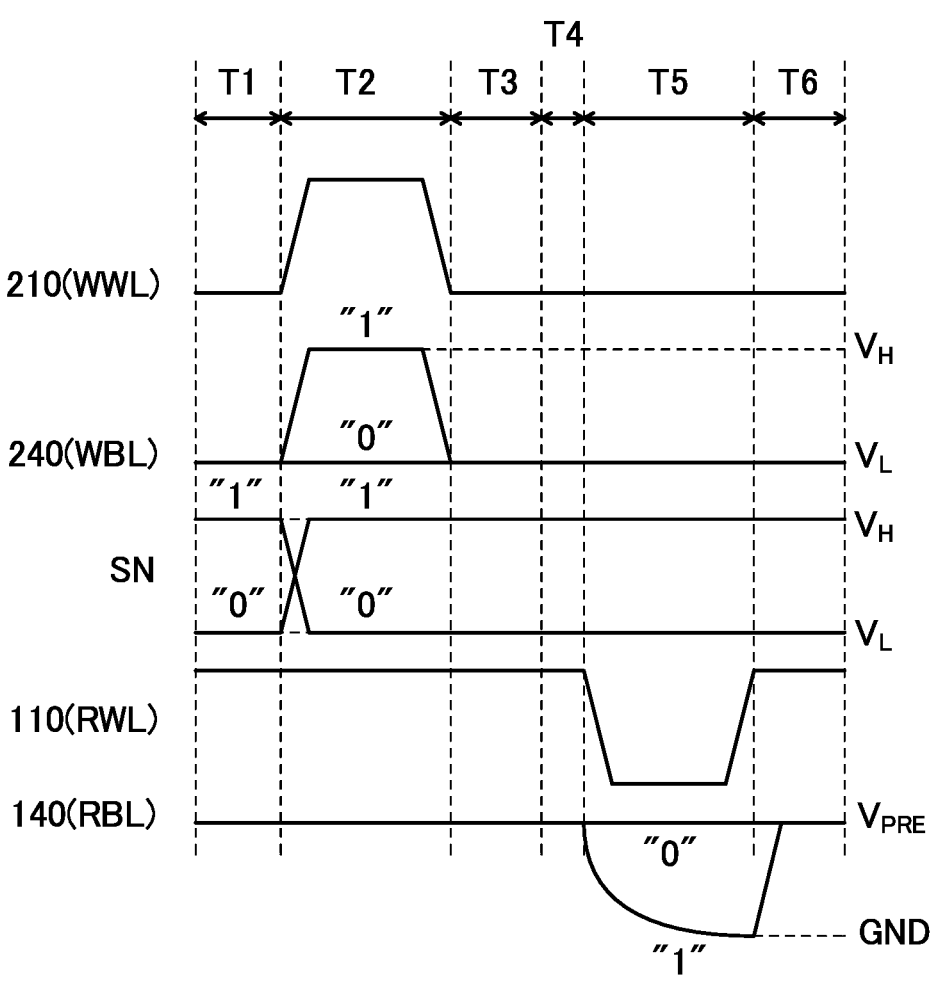
FIG. 3 is a timing chart illustrating an operation of a memory cell.

FIG. 3 is a timing chart illustrating an operation example of the memory cell 150 in FIG. 2A. In FIG. 3, the potentials supplied to the wiring 210 (WWL), the wiring 240 (WBL), and the wiring 110 (RWL), the potential of the node SN, and the potential read to the wiring 140 (RBL) are illustrated.

A period T1 is a stand-by period. A period T2 is a write period. A period T3 is a stand-by period. Periods T4 to T5 are a read period. A period T6 is a stand-by period. Note that the data written to the memory cell 150 (the node SN) through the wiring 240 (WBL) is "1" or "0" in FIG. 3. The high-level data written to the memory cell 150 is "1", and low-level data written to the memory cell 150 is "0".

The data read from the memory cell 150 through the wiring 140 (RBL) is "1" or "0" in FIG. 3. The wiring 140 (RBL) is precharged with a high-level potential (e.g., a high power supply potential such as VDD) in the read period, and data is read to an external read circuit connected to the wiring 140 (RBL) in accordance with a change from the precharged potential.

In the case where the data "1" is retained in the memory cell 150 (the node SN), a large current flows through the transistor 100 and the potential of the wiring 140 (RBL) is lowered. In the case where the data "0" is retained in the memory cell 150 (the node SN), a small current flows through the transistor 100 and the potential of the wiring 140 (RBL) varies little. In other words, in the case where the data "1" is retained in the memory cell 150 (the node SN), the potential of the wiring 140 (RBL) is at the low level, and in the case where the data "0" is retained in the memory cell 150 (the node SN), the potential of the wiring 140 (RBL) is at the high level (the precharged potential).

In the period T1, the wiring 210 (WWL) is at the low level, the wiring 240 (WBL) is at the low level ($V_L$), the wiring 110 (RWL) is at the high level, and the wiring 140 (RBL) is at the high level. At this time, the transistor 200 is in the non-conducting state. A current does not flow through the transistor 100 since the potentials of the terminals serving as the source and the drain are equal. Note that the potential of the gate of the transistor 100 (the node SN) is the potential $V_H$ or $V_L$ written in the previous write period.

In the period T2, the wiring 210 (WWL) is at the high level, the wiring 240 (WBL) is the signal corresponding to data ($V_H$ or $V_L$), the wiring 110 (RWL) is at the high level, and the wiring 140 (RBL) is at the high level. At this time, the transistor 200 is in the conducting state, and the potential of the gate of the transistor 100 (the node SN) becomes a potential corresponding to the data. A current does not flow through the transistor 100 regardless of the potential of the gate since the potentials of the terminals serving as the source and the drain are equal.

In the period T3, the wiring 210 (WWL) is at the low level, the wiring 240 (WBL) is at the low level ($V_L$), the wiring 110 (RWL) is at the high level, and the wiring 140 (RBL) is at the high level. At this time, the transistors 100 and 200 are both in the non-conducting state. In the period T3, the potential written to the gate of the transistor 100 (the node SN) is retained. A current does not flow through the transistor 100 regardless of the potential of the gate since the potentials of the terminals serving as the source and the drain are equal.

In the period T4, the wiring 210 (WWL) is at the low level, the wiring 240 (WBL) is at the low level ($V_L$), and the wiring 110 (RWL) is at the high level. The wiring 140 (RBL) is precharged with the high-level potential (a precharge potential VPRE). At this time, the transistor 200 is in the non-conducting state. The precharge potential VPRE is, for example, VDD and is equal to the high-level potential of the wiring 140 (RBL). A current does not flow through the transistor 100 regardless of the potential of the gate (the node SN) since the potentials of the terminals serving as the source and the drain are equal. In other words, the potential of the wiring 140 does not change.

In the period T5, the wiring 210 (WWL) is at the low level, the wiring 240 (WBL) is at the low level ($V_L$), and the wiring 110 (RWL) is at the low level. At this time, the transistor 200 is in the non-conducting state. The wiring 140 (RBL) is in an electrically floating state in the period T5. That is, the potential of the wiring 140 (RBL) changes in accordance with the current flowing through the transistor 100 in the memory cell 150.

In the period T5, a potential difference occurs between the terminals serving as the source and the drain of the transistor 100, and a current flows through the transistor 100 in accordance with the potential of the gate (the node SN). In the case where the data "1" is retained in the memory cell 150, a large current flows through the transistor 100 and the potential of the wiring 140 (RBL) is lowered to the low level. By this change in the potential of the wiring 140

(RBL), a sense amplifier connected to the wiring 140 (RBL) can be activated and the data in the selected memory cell 150 can be read to the outside.

In the case where the data "0" is retained in the memory cell 150, a small current flows through the transistor 100 and the potential of the wiring 140 (RBL) changes little from the high-level potential (the precharged potential).

In the memory cell 150 in a non-selected row in the period T5, the wiring 110 (RWL) is at the high level and a current does not flow through the transistor 100 regardless of the potential of the gate since the potentials of the terminals serving as the source and the drain are equal.

In the period T6, the wiring 210 (WWL) is at the low level, the wiring 240 (WBL) is at the low level ($V_L$), the wiring 110 (RWL) is at the high level, and the wiring 140 (RBL) is at the high level. At this time, the transistor 200 is in the non-conducting state. A current does not flow through the transistor 100 regardless of the potential of the gate since the potentials of the terminals serving as the source and the drain are equal.

Through the operations described above, data can be read from the memory cell 150 in the selected row.

<Memory Cell Arrangement>

Figures 4A, 4B, 4C:
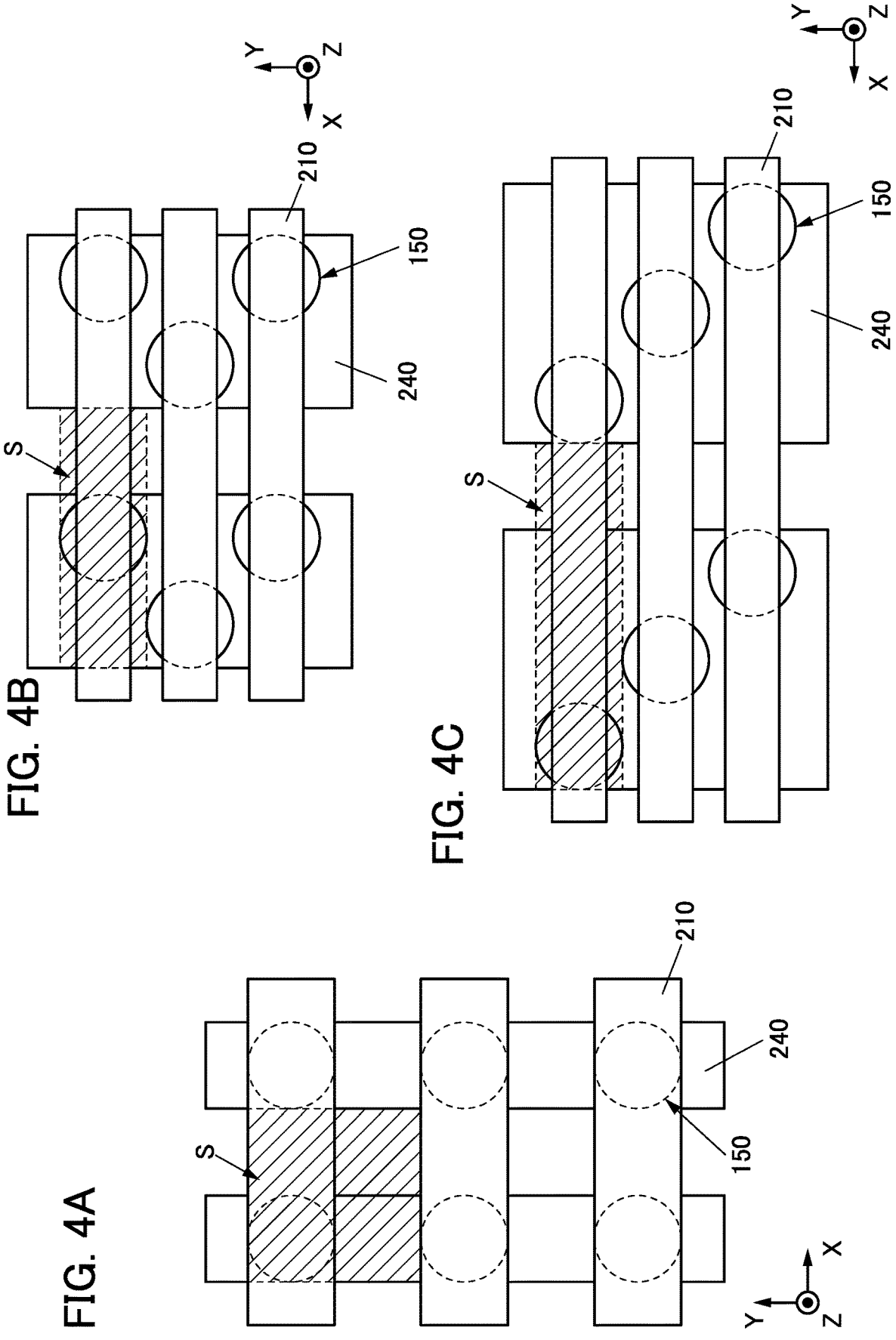
FIGS. 4A to 4C illustrate the arrangements of memory cells.

FIGS. 4A to 4C are top views illustrating arrangements of the memory cells 150. Of the wirings, only the wiring 210 and the wiring 240 are illustrated, and the wiring 110 overlapping with the wiring 210 and the wiring 140 overlapping with the wiring 240 are not illustrated.

FIG. 4A illustrates a structure where the memory cells 150 are arranged vertically and horizontally at regular intervals and the wiring 210 and the wiring 240, which are orthogonal to each other, are connected to the memory cells 150. A diagonally shaded area represents the cell area S per bit, and when the diameter or width of the memory cell 150 is G and the wiring width and wiring interval of each of the wirings 210 and 240 is also G, S is estimated at approximately $4G^2$.

FIG. 4B illustrates an example of the memory device of one embodiment of the present invention, where the width of the wiring 240 which is orthogonal to the wiring 210 is twice the width of the wiring 240 in FIG. 4A and the memory cells 150 are placed in a staggered arrangement. Furthermore, the width of the wiring 210 is smaller than the diameter or width of the memory cell 150, whereby the interval between the memory cells 150 in the longitudinal direction of the wiring 240 can be shortened. With this structure, the cell area S per bit can be less than or equal to ¾ times that of FIG. 4A; thus, high integration can be achieved.

When the width of the wiring 240 is three times that in FIG. 4A and the memory cells 150 are arranged in three columns as illustrated in FIG. 4C, the cell area S per bit is almost the same as that in FIG. 4A. Therefore, it is preferable to place the memory cells 150 in a staggered arrangement in two columns.

<Structure Example of Memory Cell>

Figure 5A:
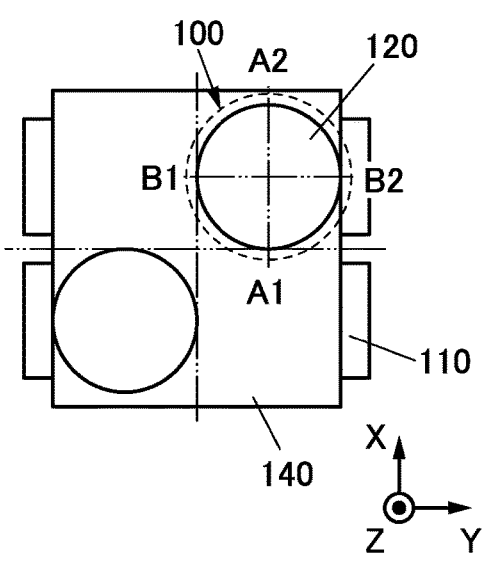
FIGS. 5A and 5B are top views illustrating a memory cell and FIGS. 5C and 5D are cross-sectional views of the memory cell.
Figure 5B:
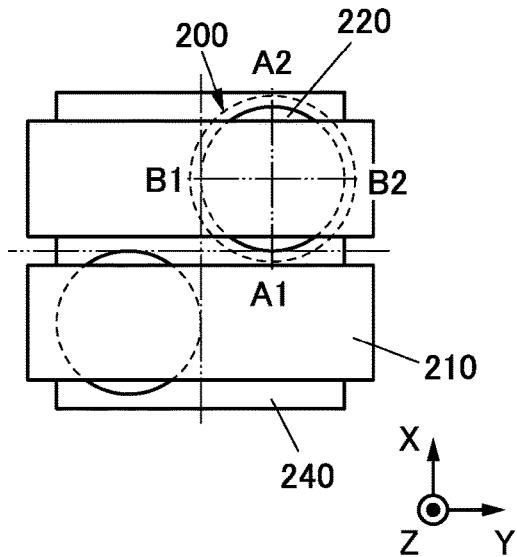
Figure 5C:
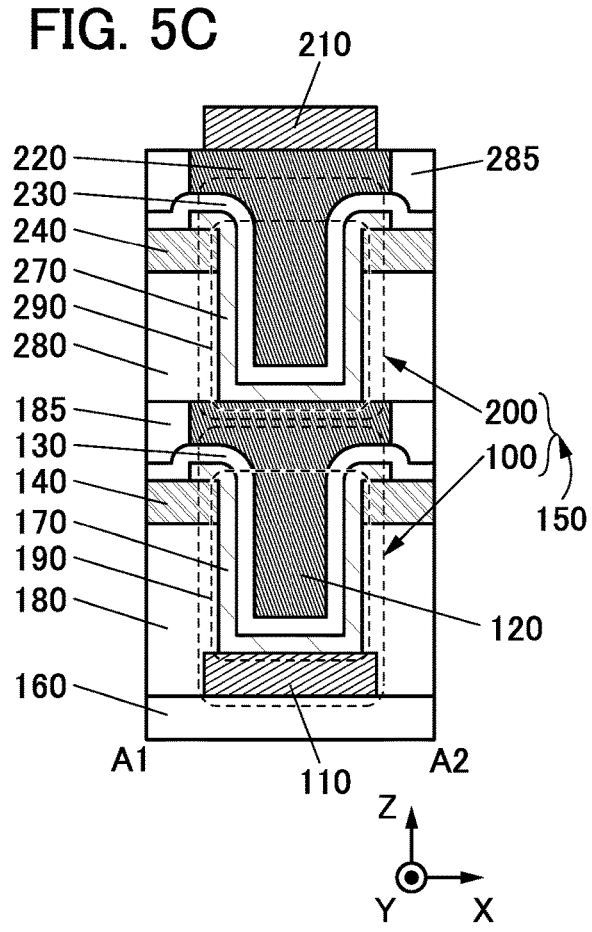
Figure 5D:
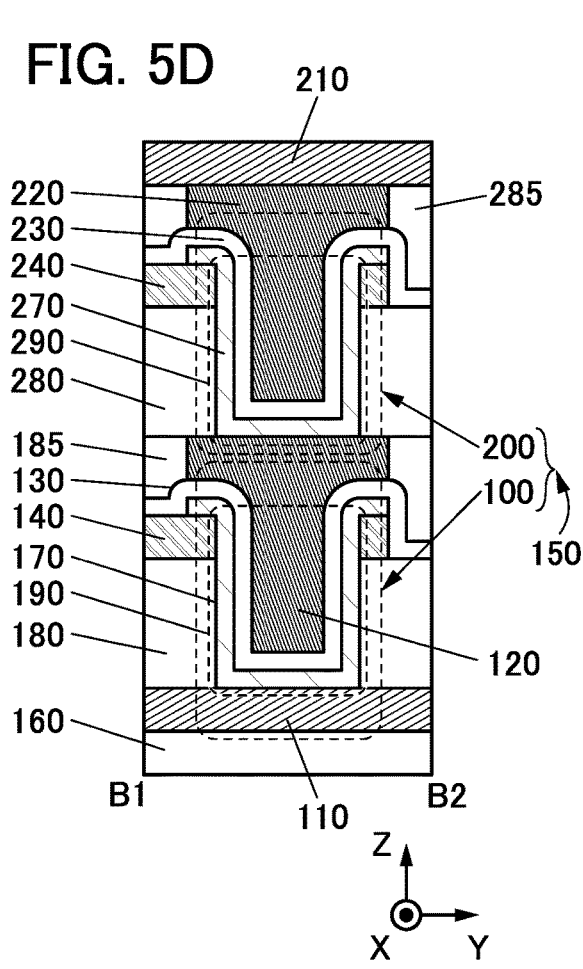

A structure of the memory cell 150 including the transistor 100 and the transistor 200 is described with reference to FIG. 1 and FIGS. 5A to 5D. FIG. 5A is a top view of the transistor 100, and FIG. 5B is a top view of the transistor 200. In the top views, some components are not illustrated for clarity. FIG. 5C is a cross-sectional view taken along a line segment A1-A2 in FIGS. 5A and 5B. FIG. 5D is a cross-sectional view taken along a line segment B1-B2 in FIGS. 5A and 5B.

In the drawings for this specification and the like, arrows indicating an X direction, a Y direction, and a Z direction are illustrated in some cases. In this specification and the like, the "X direction" is a direction along the X axis, and unless otherwise specified, the forward direction and the reverse direction are not distinguished in some cases. The same applies to the "Y direction" and the "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

The memory cell 150 includes an insulator 160 over a substrate (not illustrated), the transistor 100 over the insulator 160, and the transistor 200 over the transistor 100. Between the transistors and wirings, an insulator 180, an insulator 185, an insulator 280, an insulator 285, and the like functioning as interlayer films can be provided.

The transistor 100 includes an oxide semiconductor 170, an insulator 130, and the conductor 120. The oxide semiconductor 170 functions as a semiconductor layer, the insulator 130 functions as a gate insulator, and the conductor 120 functions as the gate electrode. The wiring 110 includes a region that functions as the one of the source electrode and the drain electrode of the transistor 100. The wiring 140 includes a region that functions as the other of the source electrode and the drain electrode of the transistor 100.

An opening portion 190 penetrating through the wiring 140 and the insulator 180 and reaching the wiring 110 is provided. The opening portion 190 has a pillar shape with a substantially circular top surface. This structure enables miniaturization or high integration of the memory cell. Note that a side surface of the opening portion 190 is preferably perpendicular to a top surface of the wiring 110.

At least part of the oxide semiconductor 170 is provided in the opening portion 190. The oxide semiconductor 170 includes a region in contact with the top surface of the wiring 110 at a bottom portion of the opening portion 190, a region in contact with a side surface of the wiring 140 in the opening portion 190, and a region in contact with at least part of a top surface of the wiring 140 outside the opening portion 190. The insulator 130 is provided so as to at least partly cover the opening portion 190. The conductor 120 is provided so that at least part of the conductor 120 is positioned in the opening portion 190. The conductor 120 is preferably provided so as to be embedded in the opening portion 190, and the top surface shape of the conductor 120 is preferably substantially circular for a higher integration degree.

The transistor 200 includes an oxide semiconductor 270, an insulator 230, and the conductor 220. The oxide semiconductor 270 functions as a semiconductor layer, the insulator 230 functions as a gate insulator, and the conductor 220 functions as the gate electrode. The conductor 120 includes a region that functions as the one of the source electrode and the drain electrode of the transistor 200. The wiring 240 includes a region that functions as the other of the source electrode and the drain electrode of the transistor 200.

An opening portion 290 penetrating through the wiring 240 and the insulator 280 and reaching the conductor 120 is provided. The opening portion 290 has a pillar shape with a substantially circular top surface. This structure enables miniaturization or high integration of the memory cell. Note that a side surface of the opening portion 290 is preferably perpendicular to a top surface of the conductor 120.

At least part of the oxide semiconductor 270 is provided in the opening portion 290. The oxide semiconductor 270 includes a region in contact with the top surface of the conductor 120 at a bottom portion of the opening portion 290, a region in contact with a side surface of the wiring 240 in the opening portion 290, and a region in contact with at least part of a top surface of the wiring 240 outside the opening portion 290. The insulator 230 is provided so as to at least partly cover the opening portion 290. The conductor 220 is provided so that at least part of the conductor 220 is positioned in the opening portion 290. The conductor 220 is preferably provided so as to be embedded in the opening portion 290, and the top surface shape of the conductor 220 is preferably substantially circular for a higher integration degree. The wiring 210 is provided over the conductor 220.

It is preferable that the diameter of the opening portion 190 and the diameter of the opening portion 290 be substantially the same and the opening portions 190 and 290 be provided so as to overlap with each other. Furthermore, in the memory cell 150, it is preferable that the width of the wiring 110 and the width of the wiring 210 be substantially the same and the wirings 110 and 210 be provided so as to overlap with each other. Moreover, in the memory cell 150, it is preferable that the width of the wiring 140 and the width of the wiring 240 be substantially the same and the wirings 140 and 240 be provided so as to overlap with each other.

With this structure, two transistors can be provided without a significant increase of the cell area, whereby the memory device including the memory cells 150 arranged at high density can have a large storage capacity. In other words, the memory device can be highly integrated.

Furthermore, the one of the source electrode and the drain electrode of the transistor 200 and the gate electrode of the transistor 100 share the same region; in other words, the transistor 200 and the transistor 100 are directly connected without a wiring or the like therebetween. Accordingly, electric resistance between the transistors can be minimum and data writing or the like can be performed quickly.

Figures 6A, 6B:
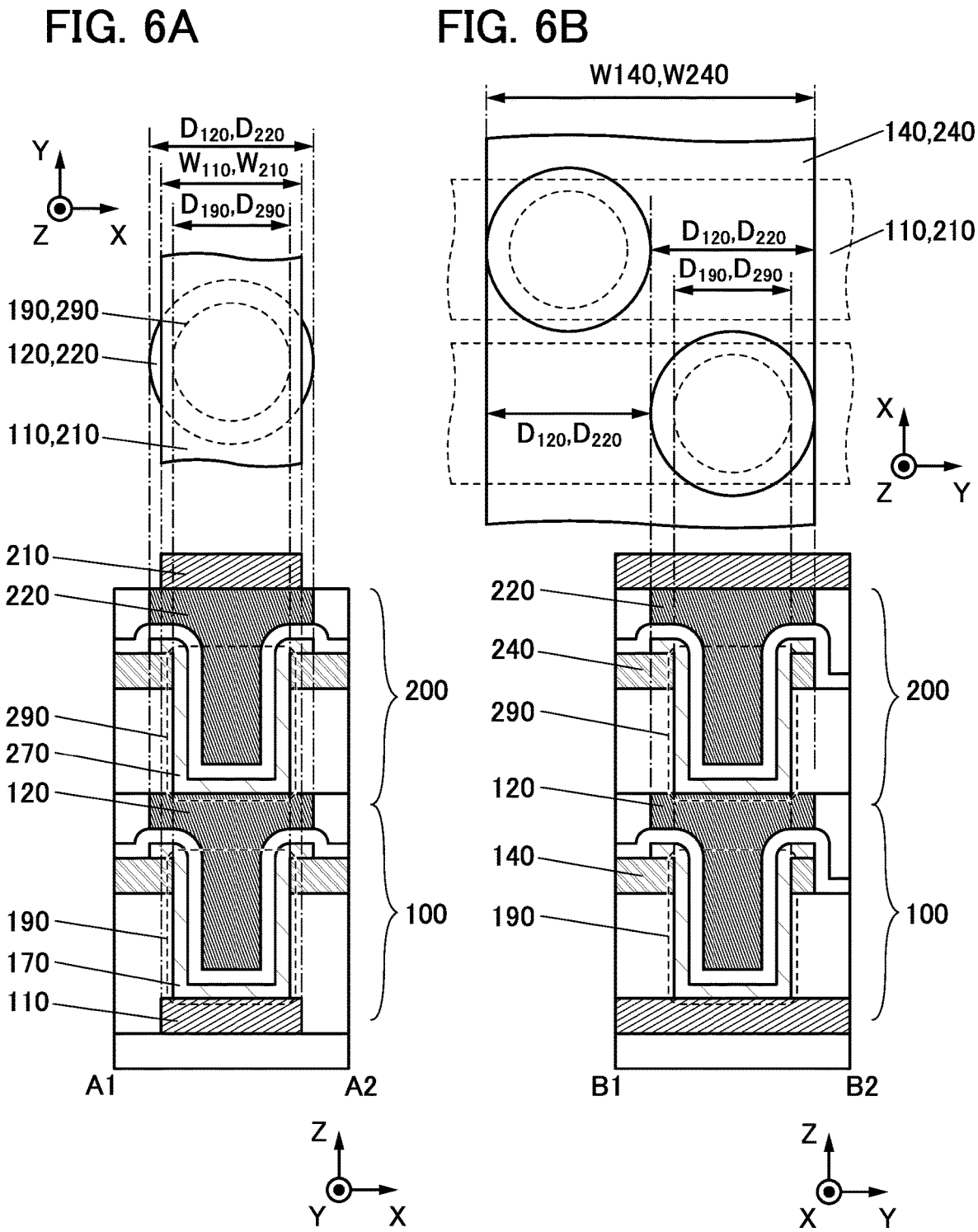
FIGS. 6A and 6B are top views and cross-sectional views illustrating the memory cell.

Next, the sizes of the components included in the memory cell 150 are described. FIG. 6A is a cross-sectional view taken along the line segment A1-A2 in the top views of FIGS. 5A and 5B and a top view illustrating some components in FIGS. 5A and 5B. FIG. 6B is a cross-sectional view taken along the line segment B1-B2 in the top views of FIGS. 5A and 5B and a top view illustrating some components in FIGS. 5A and 5B.

First, the diameter of the top surface of the conductor 120 ($D_{120}$), the diameter of a top surface of the conductor 220 ($D_{220}$), the width of the wiring 110 ($W_{110}$), and the width of the wiring 210 ($W_{210}$) are described with reference to FIG. 6A.

The conductor 120 is the gate electrode of the transistor 100 and is embedded in the opening portion 190. Since the conductor 120 also functions as the one of the source and the drain of the transistor 200, the area where the conductor 120 is in contact with the oxide semiconductor 270 included in the transistor 200 at the bottom portion of the opening portion 290 is preferably large. In other words, $D_{120}$ is preferably larger than the diameter of the opening portion 190 ($D_{190}$) and the diameter of the opening portion 290 ($D_{290}$).

Although FIGS. 6A and 6B illustrate an example where $D_{120}$ and $D_{220}$ are equal here, D220 may be smaller than $D_{120}$ as long as the conductor 220 can be embedded in the opening portion 290. Since a larger $D_{220}$ than $D_{120}$ hinders the high integration, $D_{220}$ is preferably smaller than or equal to $D_{120}$.

Since the wiring 110 also functions as the one of the source electrode and the drain electrode of the transistor 100, the area where the wiring 110 is in contact with the oxide semiconductor 170 included in the transistor 100 at the bottom portion of the opening portion 190 is preferably large. In other words, $W_{110}$ is preferably larger than $D_{190}$. Since a larger $W_{110}$ than $D_{120}$ hinders the high integration, $W_{110}$ is preferably smaller than or equal to $D_{120}$.

Although FIG. 6A illustrates an example where $W_{110}$ and $W_{210}$ are equal, $W_{210}$ may be smaller than $W_{110}$. Since a larger $W_{210}$ than $D_{120}$ hinders the high integration, $W_{210}$ is preferably smaller than or equal to $D_{120}$. $W_{210}$ may be equal to $D_{220}$. In that case, the conductor 220 and the wiring 210 may be formed using the same material through the same process.

From the above, the top surface of the conductor 120 (the diameter:$D_{120}$) is one of the top surfaces that occupy the largest area in the top view; therefore, it can be said that the diameter of the memory cell 150 in the top view is determined by $D_{120}$. In the cross-sectional view of FIG. 6A or the like, although an end portion of the conductor 120 provided over the insulator 130 is vertically illustrated, the end portion may have a tapered shape. In that case, the diameter of a portion where the conductor 120 is in contact with the insulator 130 is the largest. Thus, $D_{120}$ can be considered as the diameter of the conductor 120 in the top view. Similarly, $D_{220}$ can be considered as the diameter of the conductor 220 in the top view.

Next, the width of the wiring 140 ($W_{140}$) and the width of the wiring 240 ($W_{240}$) are described with reference to FIG. 6B.

The wiring 140 functions as the other of the source electrode and the drain electrode of the transistor 100. Since the diameter of the memory cell 150 in the top view is $D_{120}$, when the width of the wiring 140 is $2 \times D_{120}$, two memory cells 150 can be arranged in the width direction. By placing the two memory cells 150 in a staggered arrangement in the longitudinal direction of the wiring 140 as illustrated in FIG. 6B, the adjacent memory cells 150 can be separated from each other. Therefore, the width of the wiring 140 is $2 \times D_{120}$ at the maximum.

In order to place two memory cells 150 in a staggered arrangement, $W_{140}$ is at least larger than $D_{120}$. In other words, $W_{140}$ can be set to be larger than $D_{120}$ and smaller than or equal to $2 \times D_{120}$.

Furthermore, the opening portion 190 and the opening portion 290 have similar structures and preferably overlap with each other. Therefore, for the reason similar to the above, $W_{240}$, which is the width of the wiring 240 functioning as the other of the source electrode and the drain electrode of the transistor 200, can be set to be larger than $D_{120}$ and smaller than or equal to $2 \times D_{120}$.

Figure 7A:
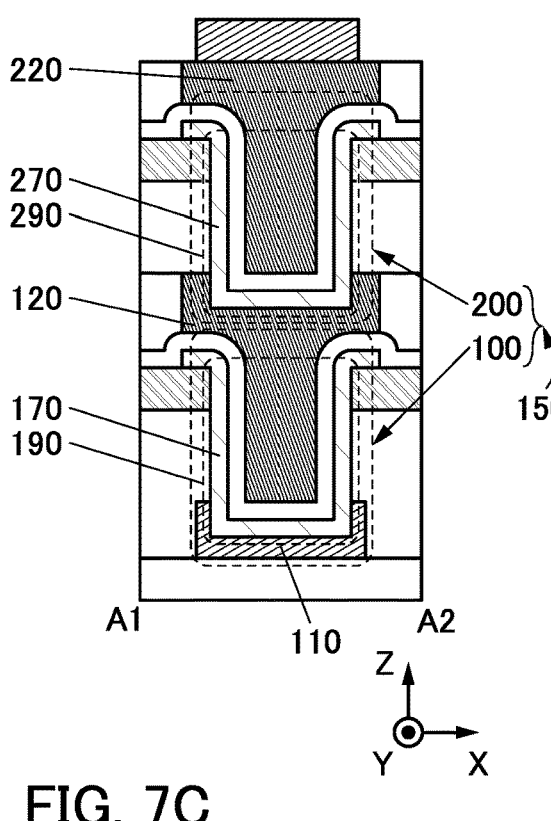
FIGS. 7A to 7D are cross-sectional views illustrating memory cells.
Figure 7B:
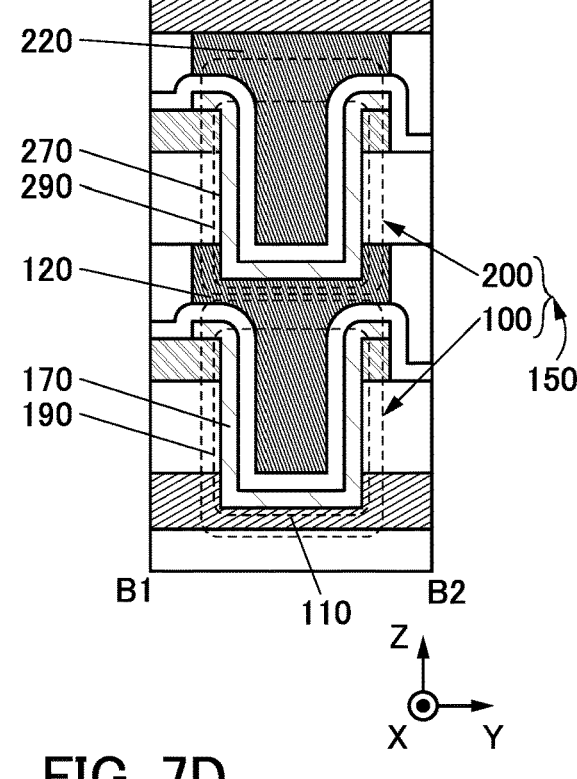

As illustrated in FIGS. 7A and 7B, the opening portion 190 where the transistor 100 is formed may reach the inside of the wiring 110.

In the structure illustrated in FIGS. 5C and 5D, during the on-state of the transistor 100, a gate electric field is not sufficiently delivered and a region where a channel is not formed (an offset region) is formed in the oxide semiconductor 170, in some cases. The offset region is often formed particularly in the vicinity of a lower end of the oxide semiconductor 170 provided on a sidewall of the opening portion 190. The offset region serves as series resistance and causes a reduction in the on-state current. The same applies to the transistor 200.

With the structure illustrated in FIGS. 7A and 7B, the region to which a gate electric field is hardly delivered can be part of the source or drain region and the offset region is less likely to be formed, whereby the on-state current can be increased, in some cases.

For the reason similar to the above, the opening portion 290 where the transistor 200 is formed may reach the inside of the conductor 120.

Figure 7C:
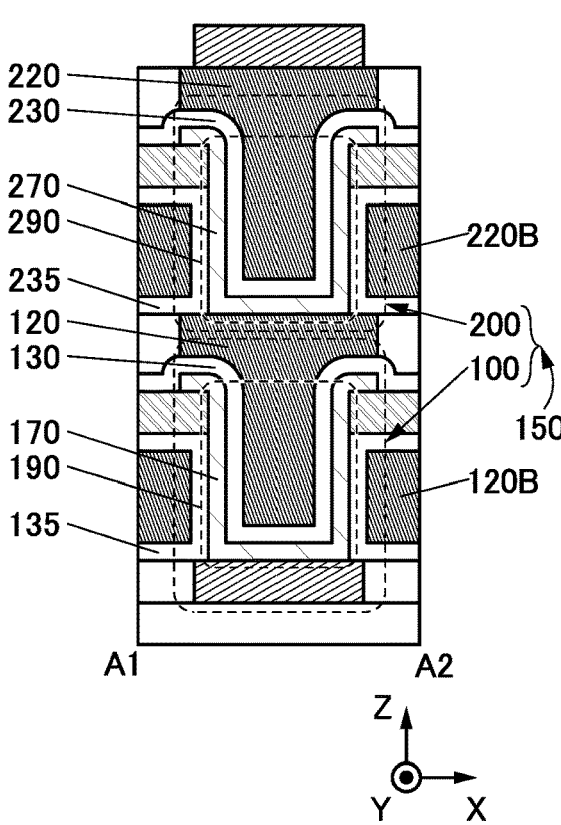
Figure 7D:
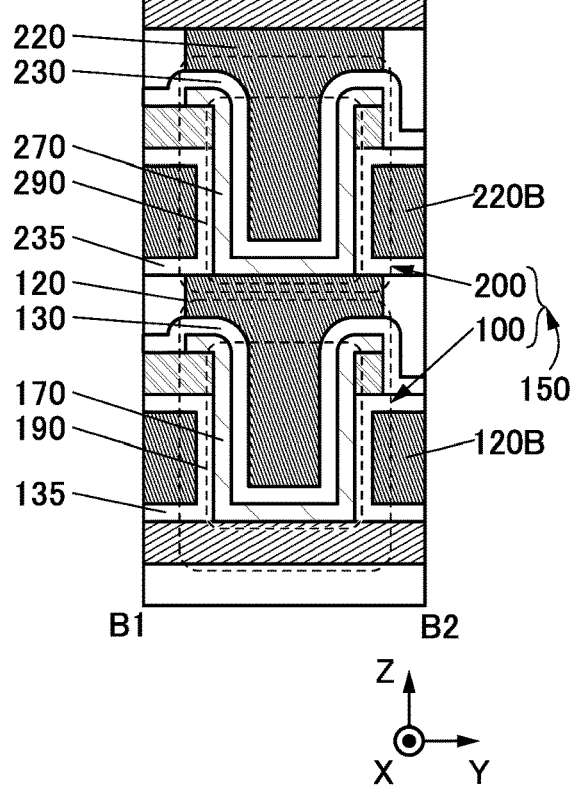

FIGS. 7C and 7D illustrate a structure example of the case illustrated in FIG. 2C where a second gate electrode (back gate) is provided for each of the transistors 100 and 200.

In the transistor 100, an insulator 135 that is part of the sidewall of the opening portion 190 can serve as a second gate insulator, and a conductor 120B facing the oxide semiconductor 170 with the insulator 135 therebetween can be provided as the second gate electrode. The conductor 120B can be connected to the wiring 250 (see FIG. 2C). In that case, the insulator 130 can be referred to as a first gate insulator, and the conductor 120 can be referred to as a first gate electrode.

In the transistor 200, an insulator 235 that is part of a sidewall of the opening portion 290 can serve as a second gate insulator, and a conductor 220B facing the oxide semiconductor 270 with the insulator 235 therebetween can be provided as the second gate electrode. The conductor 220B can be connected to the wiring 260 (see FIG. 2C). In that case, the insulator 230 can be referred to as a first gate insulator, and the conductor 220 can be referred to as a first gate electrode.

For example, the insulators 135 and 235 can be formed using a material similar to that of the insulators 130 and 230. Furthermore, the conductors 120B and 220B can be formed using a material similar to that of the conductors 120 and 220.

Note that in the transistor 200, the conductor 220B may operate as the first gate electrode, and the conductor 220 may operate as the second gate electrode. The structure illustrated in FIGS. 7A and 7B may be combined with the structure illustrated in FIGS. 7C and 7D.

[Transistors 100 and 200]

Next, the details of the transistors 100 and 200 are described. Although the transistor 100 and the transistor 200 are different in the wirings connected thereto as described above, the transistor 100 and the transistor 200 basically have the same structure, and thus the transistor 200 is described here.

As illustrated in FIGS. 5B to 5D, the transistor 200 can have a structure including the conductor 120; the wiring 240 over the insulator 280; the oxide semiconductor 270 provided in contact with the top surface of the conductor 120, which is exposed in the opening portion 290, a side surface of the insulator 280 in the opening portion 290, the side surface of the wiring 240 in the opening portion 290, and at least part of the top surface of the wiring 240; the insulator 230 provided in contact with a top surface of the oxide semiconductor 270; and the conductor 220 provided in contact with a top surface of the insulator 230.

At least part of the components of the transistor 200 is provided in the opening portion 290. Here, the bottom portion of the opening portion 290 is also the top surface of the conductor 120, and the side surface of the opening portion 290 is also the side surface of the insulator 280 and the side surface of the wiring 240.

The opening portion 290 has a pillar shape with a substantially circular top surface. This structure enables miniaturization or high integration of the memory device. Note that the side surface of the opening portion 290 is preferably perpendicular to the top surface of the wiring 110.

In order to increase the area where the transistor 200 and the transistor 100 overlap with each other, the top surface shape of the opening portion 290 is preferably the same as or similar to the top surface shape of the opening portion 190 where the transistor 100 is formed.

Portions which are of the oxide semiconductor 270, the insulator 230, and the conductor 220 and positioned in the opening portion 290 reflect the shape of the opening portion 290. Therefore, the oxide semiconductor 270 is provided so as to cover the bottom portion and the side surface of the opening portion 290, the insulator 230 is provided to cover the oxide semiconductor 270, and the conductor 220 is provided so as to be embedded in the depression, which reflects the shape of the opening portion 290, of the insulator 230.

Although an example where the opening portion 290 and the conductor 220 are substantially circular in the top view is described in this embodiment, the present invention is not limited thereto. For example, the opening portion 290 and the conductor 220 may each have an elliptical shape, a polygonal shape such as a square shape, or a polygonal shape with rounded corners such as a square shape with rounded corners in the top view. In that case, the maximum width of the opening portion 290 is calculated as appropriate in accordance with the shape of the opening portion 290 in the top view. The maximum width of the conductor 220 is calculated as appropriate in accordance with the shape of the conductor 220 in the top view.

For example, in the case where the opening portion 290 is square in the top view, the maximum width of the opening portion 290 may be the length of a diagonal line of the square. In the case where the conductor 220 is square in the top view, the maximum width of the conductor 220 may be the length of a diagonal line of the square. Alternatively, for example, in the case where the opening portion 290 and the conductor 220 have an elliptical shape, a polygonal shape, or a polygonal shape with rounded corners in the top view, the maximum widths of the opening portion 290 and the conductor 220 may be the diameter of the smallest circle (the minimum bounding circle) including the shape in a top view of the opening portion 290.

The description of the shape of the opening portion 290 can also be applied to the opening portion 190. Furthermore, the description of the shape of the conductor 220 can also be applied to the conductor 120.

Figure 8A:
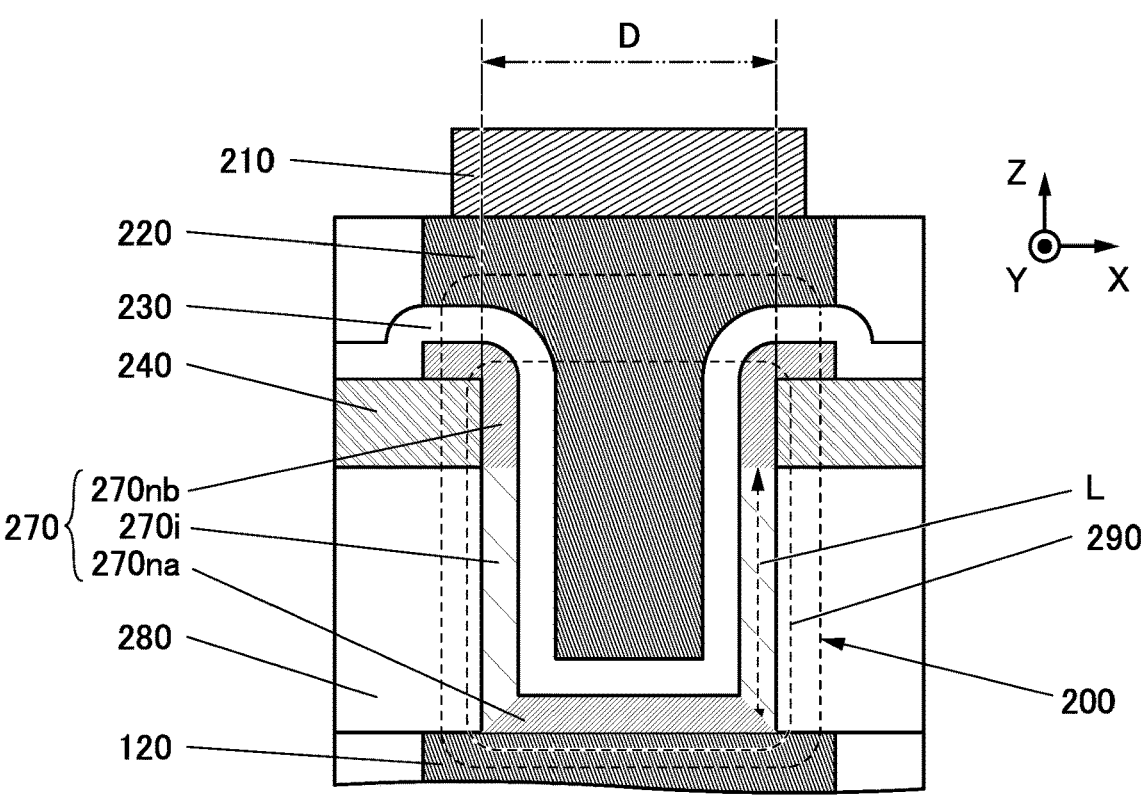
FIGS. 8A and 8B illustrate a transistor.
Figure 8B:
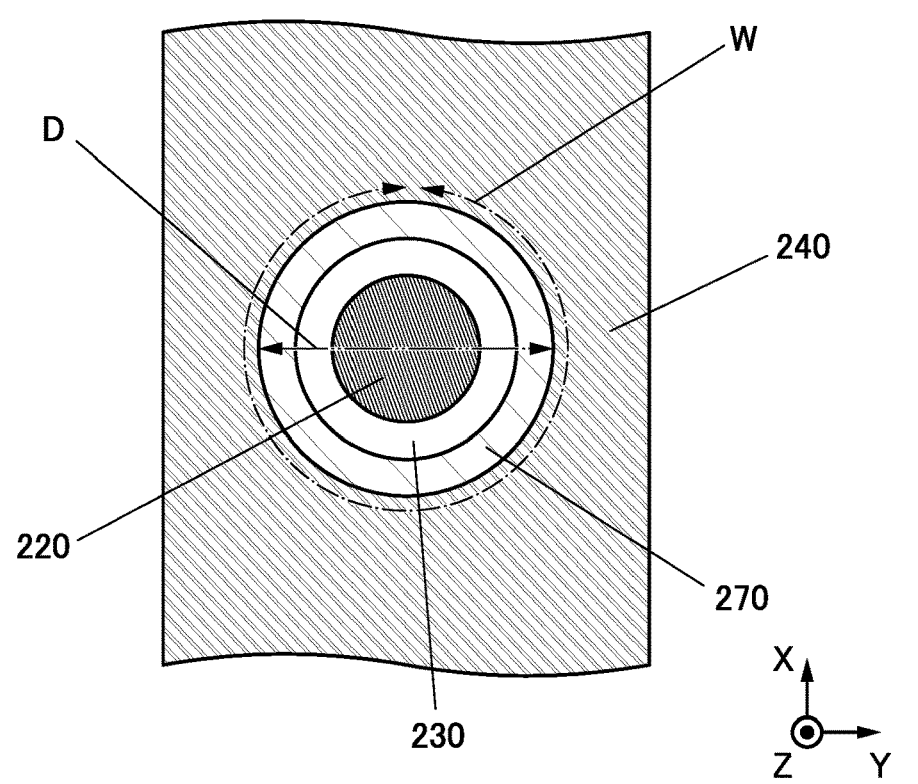

FIG. 8A is an enlarged view of the oxide semiconductor 270 and its vicinity in FIG. 5C. FIG. 8B is a cross-sectional view along the X-Y plane including the wiring 240.

As illustrated in FIG. 8A, the oxide semiconductor 270 includes a region 270i and regions 270na and 270nb provided with the region 270i positioned therebetween.

The region 270na is a region in contact with the conductor 120 in the oxide semiconductor 270. At least part of the region 270na functions as one of the source region and the drain region of the transistor 200. The region 270nb is a region in contact with the wiring 240 in the oxide semiconductor 270. At least part of the region 270nb functions as the other of the source region and the drain region of the transistor 200. As illustrated in FIG. 8B, the wiring 240 is in contact with all the perimeter of the oxide semiconductor 270. Thus, the other of the source region and the drain region of the transistor 200 can be formed along all the perimeter of a region formed in the same layer as the wiring 240 in the oxide semiconductor 270.

The region 270i is a region positioned between the region 270na and the region 270nb in the oxide semiconductor 270. At least part of the region 270i functions as the channel formation region of the transistor 200. That is, the channel formation region of the transistor 200 is formed in part of the oxide semiconductor 270 that is positioned in a region between the conductor 120 and the wiring 240. It can be said that the channel formation region of the transistor 200 is positioned in a region in contact with the insulator 280 or a region in the vicinity thereof in the oxide semiconductor 270.

The channel length of the transistor 200 is a distance between the source region and the drain region. That is, the channel length of the transistor 200 is determined by the thickness of the insulator 280 over the conductor 120. In FIG. 8A, a channel length L of the transistor 200 is indicated by a dashed double-headed arrow. The channel length L is a distance between an end portion of a region where the oxide semiconductor 270 and the conductor 120 are in contact with each other and an end portion of a region where the oxide semiconductor 270 and the wiring 240 are in contact with each other in a cross-sectional view. That is, the channel length L corresponds to the length of a side surface of the insulator 280 on the opening portion 290 side in the cross-sectional view.

In a conventional transistor, the channel length is determined by the light exposure limit of photolithography. In the present invention, the channel length can be determined by the thickness of the insulator 280. Thus, the transistor 200 can have an extremely small channel length less than or equal to the light exposure limit of photolithography (e.g., less than or equal to 60 nm, less than or equal to 50 nm, less than or equal to 40 nm, less than or equal to 30 nm, less than or equal to 20 nm, or less than or equal to 10 nm, and greater than or equal to 1 nm, or greater than or equal to 5 nm). Accordingly, the transistor 200 can have a higher on-state current and higher frequency characteristics. Thus, a memory device which operates at high speed can be provided.

In addition, as described above, the channel formation region, the source region, and the drain region can be formed in the opening portion 290. Thus, the area occupied by the transistor 200 can be reduced as compared with a conventional transistor in which the channel formation region, the source region, and the drain region are provided separately on the X-Y plane. This allows high integration of the memory device; therefore, the storage capacity per unit area can be increased.

The transistor including the channel formation region along the side surface of the insulator 280 in the opening portion 290 in the above-described manner is referred to as a vertical transistor.

Furthermore, in the X-Y plane including the channel formation region of the oxide semiconductor 270, as illustrated in FIG. 8B, the oxide semiconductor 270, the insulator 230, and the conductor 220 are provided concentrically. Therefore, a side surface of the conductor 220 provided at the center faces a side surface of the oxide semiconductor 270 with the insulator 230 therebetween. That is, in the top view, all the perimeter of the oxide semiconductor 270 serves as the channel formation region. In this case, for example, the channel width of the transistor 200 is determined by the length of the perimeter of the oxide semiconductor 270. In other words, the channel width of the transistor 200 is determined by the maximum width of the opening portion 290 (the maximum diameter in the case where the opening portion 290 is circular in the top view). In FIGS. 8A and 8B, a maximum width D of the opening portion 290 is indicated by a dashed double-dotted double-headed arrow. In FIG. 8B, a channel width W of the transistor 200 is indicated by a dashed-dotted double-headed arrow. By increasing the maximum width D of the opening portion 290, the channel width per unit area can be increased and the on-state current can be increased.

In the case where the opening portion 290 is formed by a photolithography method, the maximum width D of the opening portion 290 is determined by the light exposure limit of photolithography. In addition, the maximum width D of the opening portion 290 is determined by the film thicknesses of the oxide semiconductor 270, the insulator 230, and the conductor 220 provided in the opening portion 290. The maximum width D of the opening portion 290 is preferably, for example, greater than or equal to 5 nm, greater than or equal to 10 nm, or greater than or equal to 20 nm and less than or equal to 100 nm, less than or equal to 60 nm, less than or equal to 50 nm, less than or equal to 40 nm, or less than or equal to 30 nm. In the case where the opening portion 290 is circular in the top view, the maximum width D of the opening portion 290 corresponds to the diameter of the opening portion 290, and the channel width W can be "D× $\pi$".

In the memory device of one embodiment of the present invention, the channel length L of the transistor 200 is preferably shorter than at least the channel width W of the transistor 200. The channel length L of the transistor 200 in one embodiment of the present invention is greater than or equal to 0.1 times and less than or equal to 0.99 times, preferably greater than or equal to 0.5 times and less than or equal to 0.8 times the channel width W of the transistor 200. This structure enables a transistor with favorable electrical characteristics and high reliability.

In the case where the opening portion 290 is formed to be substantially circular in a top view, the oxide semiconductor 270, the insulator 230, and the conductor 220 are formed concentrically. This makes the distance between the conductor 220 and the oxide semiconductor 270 substantially uniform, so that a gate electric field can be substantially uniformly applied to the oxide semiconductor 270.

It is preferable that the channel formation region of the transistor including an oxide semiconductor in the semiconductor layer contain less oxygen vacancies or have a lower concentration of impurities such as hydrogen, nitrogen, or a metal element than the source region and the drain region. In some cases, hydrogen in the vicinity of an oxygen vacancy forms a defect that is an oxygen vacancy into which hydrogen enters (hereinafter sometimes referred to as VoH), which generates an electron serving as a carrier. Therefore, it is preferable that the amount of VoH be also reduced in the channel formation region. Thus, the channel formation region of the transistor is a high-resistance region having a low carrier concentration. Accordingly, the channel formation region of the transistor can be regarded as an i-type (intrinsic) or substantially i-type region.

The source region and the drain region of the transistor including an oxide semiconductor in the semiconductor layer are regions which have lower resistances than the channel formation region by having increased carrier concentrations because of containing more oxygen vacancies or more VoH or having higher concentrations of impurities such as hydrogen, nitrogen, or a metal element. In other words, the source region and the drain region of the transistor are n-type regions having higher carrier concentrations and lower resistances than the channel formation region.

Although the opening portion 290 is provided so that the side surface of the opening portion 290 is perpendicular to the top surface of the conductor 120 in FIG. 8A and the like, the present invention is not limited thereto. For example, the side surface of the opening portion 290 may have a tapered shape.

The band gap of the metal oxide used as the oxide semiconductor 270 is preferably greater than or equal to 2.0 eV, further preferably greater than or equal to 2.5 eV. The use of such a metal oxide having a wide band gap as the oxide semiconductor 270 can reduce the off-state current of the transistor. By using a transistor with a low off-state current in a memory cell, stored data can be held for along time. In other words, such a memory device does not require refresh operation or has an extremely low frequency of refresh operation, leading to a sufficient reduction in power consumption. The frequency of refresh operation in a general DRAM is approximately once per 60 msec, whereas the frequency of refresh operation in the memory device of one embodiment of the present invention can be approximately once per 10 sec, which is greater than or equal to 10 times or greater than or equal to 100 times that of the general DRAM. In the memory device of one embodiment of the present invention, the frequency of refresh operation can be once per period of more than or equal to 1 sec and less than or equal to 100 sec, preferably once per period of more than or equal to 5 sec and less than or equal to 50 sec.

As the oxide semiconductor 270, a single layer or stacked layers including any of the metal oxides described in [Metal oxide] below can be used.

As the oxide semiconductor 270, a metal oxide with a composition of In:M:Zn=1:3:2 [atomic ratio] or in the neighborhood thereof, a metal oxide with a composition of In:M:Zn=1:3:4 [atomic ratio] or in the neighborhood thereof, a metal oxide with a composition of In:M:Zn=1:1:0.5 [atomic ratio] or in the neighborhood thereof, a metal oxide with a composition of In:M:Zn=1:1:1 [atomic ratio] or in the neighborhood thereof, a metal oxide with a composition of In:M:Zn=1:1:1.2 [atomic ratio] or in the neighborhood thereof, a metal oxide with a composition of In:M:Zn=1:1:2 [atomic ratio] or in the neighborhood thereof, or a metal oxide with a composition of In:M:Zn=4:2:3 [atomic ratio] or in the neighborhood thereof may be specifically used. Note that the neighborhood of an atomic ratio includes ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

Analysis of the composition of the metal oxide used as the oxide semiconductor 270 can be performed by energy dispersive X-ray spectrometry (EDX), X-ray photoelectron spectrometry (XPS), inductively coupled plasma-mass spectrometry (ICP-MS), or inductively coupled plasma-atomic emission spectrometry (ICP-AES), for example. Alternatively, these methods may be combined to be employed for analysis. As for an element whose content is low, the actual content may be different from the content obtained by analysis because of the influence of the analysis accuracy. In the case where the content of the element M is low, for example, the content of the element M obtained by analysis may be lower than the actual content.

A sputtering method or an atomic layer deposition (ALD) method can be suitably used for depositing the metal oxide. Note that in the case where the metal oxide is deposited by a sputtering method, the atomic ratio of the deposited metal oxide may be different from the atomic ratio of a sputtering target. In particular, the zinc content of the deposited metal oxide may be reduced to approximately 50% of that of the sputtering target.

The oxide semiconductor 270 preferably has crystallinity. Examples of an oxide semiconductor having crystallinity include a c-axis aligned crystalline oxide semiconductor (CAAC-OS), a nanocrystalline oxide semiconductor (nc-OS), a polycrystalline oxide semiconductor, and a single-crystal oxide semiconductor. For the oxide semiconductor 270, CAAC-OS or nc-OS is preferably used, and CAAC-OS is particularly preferably used.

CAAC-OS preferably includes a plurality of layered crystal regions and a c-axis is preferably aligned in a normal direction of a surface where the CAAC-OS is deposited. For example, the oxide semiconductor 270 preferably includes a layered crystal that is substantially parallel to the side surface of the opening portion 290, particularly the side surface of the insulator 280. With this structure, the layered crystal of the oxide semiconductor 270 is formed substantially parallel to the channel length direction of the transistor 200, so that the on-state current of the transistor can be increased.

The CAAC-OS is a metal oxide having a dense structure with high crystallinity and a small amount of impurities and defects (e.g., oxygen vacancies). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. As the density of the CAAC-OS is increased in such a manner, diffusion of impurities or oxygen in the CAAC-OS can be further reduced.

In the CAAC-OS, a reduction in electron mobility due to a crystal grain boundary is less likely to occur because it is difficult to observe a clear crystal grain boundary. Thus, a metal oxide including the CAAC-OS is physically stable.

Accordingly, the metal oxide including the CAAC-OS is resistant to heat and has high reliability.

When an oxide having crystallinity, such as CAAC-OS, is used as the oxide semiconductor 270, oxygen extraction from the oxide semiconductor 270 by source or drain electrodes can be inhibited. In this case, extraction of oxygen from the oxide semiconductor 270 can be inhibited even when heat treatment is performed; hence, the transistor 200 is stable against high temperatures in the manufacturing process (i.e., thermal budget).

The crystallinity of the oxide semiconductor 270 can be analyzed with an X-ray diffraction (XRD) pattern, a transmission electron microscope (TEM) image, or an electron diffraction (ED) pattern, for example. Alternatively, these methods may be combined to be employed for analysis.

Although the oxide semiconductor 270 being a single layer is illustrated in FIGS. 5C and 5D and the like, the present invention is not limited thereto. The oxide semiconductor 270 may have a stacked-layer structure of a plurality of oxide layers with different chemical compositions. For example, a structure in which a plurality of kinds of metal oxides selected from the above-described metal oxides are stacked as appropriate may be used.

In the case where the oxide semiconductor 270 has a three-layer structure, the oxide semiconductor 270 may have a structure in which a metal oxide with a composition of In:Ga:Zn=1:1:1 [atomic ratio] or in the neighborhood thereof, a metal oxide with a composition of In:Zn=1:1 [atomic ratio] or in the neighborhood thereof or with a composition of In:Zn=4:1 [atomic ratio] or in the neighborhood thereof, and a metal oxide with a composition of In:Ga:Zn=1:1:1 [atomic ratio] or in the neighborhood thereof are provided in order from the conductor 120 side. With this structure, the on-state current of the transistor 200 can be increased, and the transistor can have high reliability with small variations.

As the insulator 230, a single layer or stacked layers of any of the insulators described in [Insulator] below can be used. For example, silicon oxide or silicon oxynitride can be used as the insulator 230. Silicon oxide or silicon oxynitride is preferable because of being thermally stable.

As the insulator 230, any of materials with high dielectric constants, that is, high-k materials, described in [Insulator] below may be used. For example, hafnium oxide, aluminum oxide, or the like may be used.

The thickness of the insulator 230 is preferably greater than or equal to 0.5 nm and less than or equal to 15 nm, further preferably greater than or equal to 0.5 nm and less than or equal to 12 nm, still further preferably greater than or equal to 0.5 nm and less than or equal to 10 nm. The insulator 230 at least partly includes a region with the above thickness.

The concentration of impurities such as water or hydrogen in the insulator 230 is preferably reduced. This can inhibit entry of impurities such as water or hydrogen into the channel formation region of the oxide semiconductor 270.

As illustrated in FIGS. 5C and 5D, part of the insulator 230 is positioned outside the opening portion 290, that is, over the wiring 240 and the insulator 280. In this case, the insulator 230 preferably covers a side end portion of the oxide semiconductor 270 in order to prevent a short circuit between the conductor 220 and the oxide semiconductor 270. Furthermore, the insulator 230 preferably covers a side end portion of the wiring 240 in order to prevent a short circuit between the conductor 220 and the wiring 240.

Although the insulator 230 being a single layer is illustrated in FIGS. 5C and 5D, the present invention is not limited thereto. The insulator 230 may have a stacked-layer structure.

As the conductor 220, a single layer or stacked layers of any of the conductors described in [Conductor] below can be used. For example, a conductive material with high conductivity such as tungsten can be used as the conductor 220.

In that case, a conductive material that is not easily oxidized, a conductive material having a function of inhibiting diffusion of oxygen, or the like is preferably used as the conductor 220. Examples of the conductive material include a conductive material containing nitrogen (e.g., titanium nitride or tantalum nitride) and a conductive material containing oxygen (e.g., ruthenium oxide). Thus, a decrease in conductivity of the conductor 220 can be inhibited.

Although the conductor 220 being a single layer is illustrated in FIGS. 5C and 5D, the present invention is not limited thereto. The conductor 220 may have a stacked-layer structure.

As the wiring 240, a single layer or stacked layers of any of the conductors described in [Conductor] below can be used. For example, a conductive material with high conductivity such as tungsten can be used as the wiring 240.

A conductive material that is not easily oxidized, a conductive material having a function of inhibiting diffusion of oxygen, or the like is preferably used as the wiring 240, as in the conductor 220. For example, titanium nitride, tantalum nitride, or the like can be used. With such a structure, the wiring 240 can be inhibited from being excessively oxidized by the oxide semiconductor 270.

Alternatively, a structure in which tungsten is stacked over titanium nitride may be used, for example. When tungsten is stacked in this manner, the conductivity of the wiring 240 can be improved.

In the case where the wiring 240 has a structure where a first conductor and a second conductor are stacked, the first conductor may be formed using a conductive material with high conductivity and the second conductor may be formed using a conductive material containing oxygen, for example. When a conductive material containing oxygen is used as the second conductor of the wiring 240 that is in contact with the insulator 230, oxygen in the insulator 230 can be prevented from diffusing into the first conductor of the wiring 240. For example, tungsten is preferably used as the first conductor of the wiring 240, and indium tin oxide to which silicon is added is preferably used as the second conductor of the wiring 240.

When the oxide semiconductor 270 and the conductor 120 are in contact with each other, a metal compound or oxygen vacancies are formed, so that the resistance of the region 270na in the oxide semiconductor 270 is reduced. The reduction in the resistance of the oxide semiconductor 270 in contact with the conductor 120 can reduce the contact resistance between the oxide semiconductor 270 and the conductor 120. Similarly, when the oxide semiconductor 270 and the wiring 240 are in contact with each other, the resistance of the region 270nb in the oxide semiconductor 270 is reduced. Accordingly, the contact resistance between the oxide semiconductor 270 and the wiring 240 can be reduced.

The insulator 280 functions as an interlayer film and preferably has a low dielectric constant. In the case where a material with a low dielectric constant is used for an interlayer film, the parasitic capacitance between wirings can be reduced. As the insulator 280, a single layer or stacked layers of an insulator containing any of the materials with low dielectric constants described in [Insulator] below can be used. Silicon oxide and silicon oxynitride, which have thermal stability, are preferable.

The concentration of impurities such as water or hydrogen in the insulator 280 is preferably reduced. This can inhibit entry of impurities such as water or hydrogen into the channel formation region of the oxide semiconductor 270.

As the insulator 280, an insulator containing oxygen that is released by heating (hereinafter, sometimes referred to as excess oxygen) is preferably used. By performing heat treatment on the insulator 280 containing excess oxygen, oxygen can be supplied from the insulator 280 to the channel formation region of the oxide semiconductor 270 and oxygen vacancies and VoH can be reduced. Thus, electrical characteristics of the transistor 200 can be stabilized and the reliability can be improved.

As the insulator 280, any of the insulators having a function of capturing or fixing hydrogen described in [Insulator] below may be used. With this structure, hydrogen in the oxide semiconductor 270 can be captured or fixed, so that the concentration of hydrogen in the oxide semiconductor 270 can be reduced. As the insulator 280, magnesium oxide, aluminum oxide, or the like can be used.

Although the insulator 280 being a single layer is illustrated in FIGS. 5C and 5D, the present invention is not limited thereto. The insulator 280 may have a stacked-layer structure.

<Materials of Memory Device>

Materials that can be used for the memory device are described below.

[Substrate]

As a substrate over which the transistor 100 and the transistor 200 are formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Another example is any of the above semiconductor substrates provided with an insulator region, such as a silicon on insulator (SOI) substrate. Examples of the conductor substrate include a graphite substrate, a metal substrate, an alloy substrate, and a conductive resin substrate. Other examples include a substrate containing a nitride of a metal and a substrate containing an oxide of a metal. An insulator substrate provided with a conductor or a semiconductor, a semiconductor substrate provided with a conductor or an insulator, a conductor substrate provided with a semiconductor or an insulator, or the like may be used. Alternatively, these substrates provided with elements may be used. Examples of the element provided over the substrate include a capacitor, a resistor, a switching element, a light-emitting element, and a memory element.

[Insulator]

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of a leakage current may arise because of a thin gate insulator. When a high-k material is used for the insulator functioning as a gate insulator, the voltage at the time of operation of the transistor can be reduced while the physical thickness is maintained. In addition, the equivalent oxide thickness (EOT) of the insulator functioning as the gate insulator can be reduced. By contrast, when a low-dielectric-constant material is used for the insulator functioning as an interlayer film, parasitic capacitance generated between wirings can be reduced. Thus, a material is preferably selected depending on the function of an insulator. Note that a material with a low dielectric constant is a material with high dielectric strength.

Examples of a material with a high dielectric constant (a high-k material) include aluminum oxide, gallium oxide, hafnium oxide, tantalum oxide, zirconium oxide, hafnium zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of a material with a low dielectric constant include inorganic insulating materials such as silicon oxide, silicon oxynitride, and silicon nitride oxide, and resins such as polyester, polyolefin, polyamide (e.g., nylon and aramid), polyimide, polycarbonate, and acrylic. Other examples of an inorganic insulating material with a low dielectric constant include silicon oxide to which fluorine is added, silicon oxide to which carbon is added, and silicon oxide to which carbon and nitrogen are added. Another example is porous silicon oxide. Note that these silicon oxides may contain nitrogen.

A transistor including a metal oxide can have stable electrical characteristics when surrounded by an insulator having a function of inhibiting transmission of impurities and oxygen. The insulator having a function of inhibiting transmission of impurities and oxygen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of impurities and oxygen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

An insulator that is in contact with a semiconductor layer or provided in the vicinity of the semiconductor layer, such as a gate insulator, preferably includes a region containing excess oxygen. For example, when an insulator including a region containing excess oxygen is in contact with a semiconductor layer or provided in the vicinity of the semiconductor layer, the number of oxygen vacancies in the semiconductor layer can be reduced. Examples of an insulator in which a region containing excess oxygen is easily formed include silicon oxide, silicon oxynitride, and porous silicon oxide.

Examples of the insulator having a barrier property against oxygen include an oxide containing one or both of aluminum and hafnium, an oxide containing hafnium and silicon (hafnium silicate), magnesium oxide, gallium oxide, gallium zinc oxide, indium gallium zinc oxide, silicon nitride, and silicon nitride oxide. Examples of an oxide containing one or both of aluminum and hafnium include aluminum oxide, hafnium oxide, and an oxide containing aluminum and hafnium (hafnium aluminate).

Examples of an insulator having a barrier property against hydrogen include aluminum oxide, magnesium oxide, hafnium oxide, gallium oxide, indium gallium zinc oxide, silicon nitride, and silicon nitride oxide.

An insulator having a barrier property against oxygen and an insulator having a barrier property against hydrogen can each be regarded as an insulator having a barrier property against one or both of oxygen and hydrogen.

Examples of an insulator having a function of capturing or fixing hydrogen include an oxide containing magnesium and an oxide containing one or both of aluminum and hafnium. These oxides preferably have an amorphous structure. In such an oxide having an amorphous structure, an oxygen atom has a dangling bond, and the oxide has a property of capturing or fixing hydrogen with the dangling bond in some cases. Although these oxides preferably have an amorphous structure, a crystal region may be partly formed.

Note that in this specification and the like, a barrier insulating film refers to an insulating film having a barrier property. In addition, the barrier property refers to a property that does not easily allow diffusion of a target substance (also referred to as a property that does not easily allow passage of a target substance, a property with low permeability of a target substance, or a function of inhibiting diffusion of a target substance). Note that a function of capturing or fixing (also referred to as gettering) a target substance can be rephrased as a barrier property. Note that hydrogen described as a target substance refers to at least one of a hydrogen atom, a hydrogen molecule, a water molecule, and a substance bonded to hydrogen, such as OH—. Unless otherwise specified, an impurity described as a target substance refers to an impurity in a channel formation region or a semiconductor layer, and for example, refers to at least one of a hydrogen atom, a hydrogen molecule, a water molecule, a nitrogen atom, a nitrogen molecule, a nitrogen oxide molecule (e.g., $N_2O$, NO, or $NO_2$), and a copper atom. Oxygen described as a target substance refers to, for example, at least one of an oxygen atom, an oxygen molecule, and the like. Specifically, a barrier property against oxygen refers to a property that does not easily allow diffusion of at least one of an oxygen atom, an oxygen molecule, and the like.

[Conductor]

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. As an alloy containing any of the above metal elements, a nitride of the alloy or an oxide of the alloy may be used. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Alternatively, a semiconductor having high electric conductivity, typified by polycrystalline silicon containing an impurity element such as phosphorus, or silicide such as nickel silicide may be used.

A conductive material containing nitrogen, such as a nitride containing tantalum, a nitride containing titanium, a nitride containing molybdenum, a nitride containing tungsten, a nitride containing ruthenium, a nitride containing tantalum and aluminum, or a nitride containing titanium and aluminum; a conductive material containing oxygen, such as ruthenium oxide, an oxide containing strontium and ruthenium, or an oxide containing lanthanum and nickel; or a material containing a metal element such as titanium, tantalum, or ruthenium is preferable because it is a conductive material that is not easily oxidized, a conductive material having a function of inhibiting oxygen diffusion, or a material maintaining its conductivity even after absorbing oxygen. As examples of the conductive material containing oxygen, indium oxide containing tungsten oxide, indium oxide containing titanium oxide, indium tin oxide, indium tin oxide containing titanium oxide, indium tin oxide to which silicon is added, indium zinc oxide, indium zinc oxide containing tungsten oxide, and the like can be given. In this specification and the like, a conductive film formed using the conductive material containing oxygen may be referred to as an oxide conductive film.

In addition, a conductive material containing tungsten, copper, or aluminum as its main component is preferable because it has high conductivity.

Conductive layers formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed.

Further alternatively, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. A conductive material containing any of the above metal elements and nitrogen may also be used. For example, a conductive material containing nitrogen, such as titanium nitride or tantalum nitride, may be used. One or more of indium tin oxide, indium oxide containing tungsten oxide, indium zinc oxide containing tungsten oxide, indium oxide containing titanium oxide, indium tin oxide containing titanium oxide, indium zinc oxide, and indium tin oxide to which silicon is added may be used. Indium gallium zinc oxide containing nitrogen may be used. With the use of such a material, hydrogen contained in the metal oxide where the channel is formed can be captured in some cases. Hydrogen entered from a surrounding insulator or the like can also be captured in some cases.

[Metal Oxide]

A metal oxide has a lattice defect in some cases. Examples of the lattice defect include point defects such as an atomic vacancy and an exotic atom, linear defects such as transition, plane defects such as a grain boundary, and volume defects such as a cavity. Examples of a factor in generating a lattice defect include the deviation of the proportion of the number of atoms in constituent elements (excess or deficiency of constituent atoms) and an impurity.

When a metal oxide is used for a semiconductor layer of a transistor, a lattice defect in the metal oxide might cause generation, capture, or the like of a carrier. Thus, when a metal oxide with a large number of lattice defects is used for a semiconductor layer of a transistor, the electrical characteristics of the transistor might be unstable. Therefore, a metal oxide used for a semiconductor layer of a transistor preferably has a small number of lattice defects.

As for a transistor using a metal oxide, particularly when oxygen vacancies (Vo) and impurities are in a channel formation region of the metal oxide, electrical characteristics of the transistor easily vary and the reliability thereof might be degraded. In some cases, hydrogen in the vicinity of an oxygen vacancy forms a defect that is an oxygen vacancy into which hydrogen enters (hereinafter sometimes referred to as VoH), which generates an electron serving as a carrier. Thus, if the channel formation region of the metal oxide includes oxygen vacancies, the transistor tends to have normally-on characteristics. Therefore, the oxygen vacancies and the impurities are preferably reduced as much as possible in the channel formation region in the metal oxide. In other words, the metal oxide preferably includes an i-type (intrinsic) or substantially i-type channel formation region with a low carrier concentration.

The kind of a lattice defect that is likely to exist in a metal oxide and the number of lattice defects that exist vary depending on the structure of the metal oxide, a method for depositing the metal oxide, or the like.

Structures of metal oxides are classified into a single crystal structure and other structures (non-single-crystal structures). Examples of non-single-crystal structures include a CAAC structure, a polycrystalline structure, an nc structure, an amorphous-like (a-like) structure, and an amorphous structure. An a-like structure has a structure between an nc structure and an amorphous structure. Note that the classification of crystal structures will be described later.

A metal oxide having an a-like structure and a metal oxide having an amorphous structure each include a void or a low-density region. That is, a metal oxide having an a-like structure and a metal oxide having an amorphous structure each have lower crystallinity than a metal oxide having an nc structure and a metal oxide having a CAAC structure. Moreover, a metal oxide having an a-like structure has higher hydrogen concentration in the metal oxide than a metal oxide having an nc structure and a metal oxide having a CAAC structure. Thus, a lattice defect is likely to be generated in a metal oxide having an a-like structure and a metal oxide having an amorphous structure.

Therefore, a metal oxide with high crystallinity is preferably used for a semiconductor layer of a transistor. For example, a metal oxide having a CAAC structure or a metal oxide having a single crystal structure is preferably used. The use of the metal oxide for a transistor enables the transistor to have favorable electrical characteristics. In addition, the transistor can have high reliability.

For the channel formation region of a transistor, a metal oxide that increases the on-state current of the transistor is preferably used. To increase the on-state current of the transistor, the mobility of the metal oxide used for the transistor is increased. To increase the mobility of the metal oxide, the transfer of carriers (electrons in the case of an n-channel transistor) needs to be facilitated or scattering factors that affect the carrier transfer need to be reduced. Note that the carriers flow from the source to the drain through the channel formation region. Hence, the on-state current of the transistor can be increased by providing a channel formation region through which carriers can easily flow in the channel length direction.

Here, it is preferable to use a metal oxide with high crystallinity for a metal oxide including a channel formation region. The crystal preferably has a crystal structure where a plurality of layers (for example, a first layer, a second layer, and a third layer) are stacked. That is, the crystal has a layered crystal structure (also referred to as a layered crystal or a layered structure). At this time, the direction of the c-axis of the crystal is the direction in which the plurality of layers are stacked. Examples of a metal oxide including the crystal include a single crystal oxide semiconductor and a c-axis aligned crystalline oxide semiconductor (CAAC-OS).

The c-axis of the above crystal is preferably aligned in the normal direction with respect to the formation surface or film surface of the metal oxide. This enables the plurality of layers to be placed parallel to or substantially parallel to the formation surface or film surface of the metal oxide. In other words, the plurality of layers extend in the channel length direction.

The above layered crystal structure including three layers is as follows, for example. The first layer has a coordination geometry of atoms that has an octahedral structure of oxygen in which a metal included in the first layer is positioned at the center. The second layer has a coordination geometry of atoms that has a trigonal bipyramidal or tetrahedral structure of oxygen in which a metal included in the second layer is positioned at the center. The third layer has a coordination geometry of atoms that has a trigonal bipyramidal or tetrahedral structure of oxygen in which a metal included in the third layer is positioned at the center.

Examples of the crystal structure of the above crystal are a $YbFe_2O_4$ structure, a $Yb_2Fe_3O_7$ structure, their deformed structures, and the like.

Preferably, each of the first to third layers is composed of one metal element or a plurality of metal elements with the same valence and oxygen. The valence of the one or plurality of metal elements contained in the first layer is preferably equal to the valence of the one or plurality of metal elements contained in the second layer. The first layer and the second layer may contain the same metal element. The valence of the one or plurality of metal elements contained in the first layer is preferably different from the valence of the one or plurality of metal elements contained in the third layer.

The above structure can increase the crystallinity of the metal oxide, which leads to an increase in the mobility of the metal oxide. Thus, the use of the metal oxide for the channel formation region of the transistor increases the on-state current of the transistor, leading to an improvement in the electrical characteristics of the transistor.

Examples of the metal oxide in one embodiment of the present invention include indium oxide, gallium oxide, and zinc oxide. The metal oxide in one embodiment of the present invention preferably contains at least indium (In) or zinc (Zn). The metal oxide preferably contains two or three selected from indium, an element M, and zinc. The element M is a metal element or metalloid element that has a high bonding energy with oxygen, such as a metal element or metalloid element whose bonding energy with oxygen is higher than that of indium. Specific examples of the element M include aluminum, gallium, tin, yttrium, titanium, vanadium, chromium, manganese, iron, cobalt, nickel, zirconium, molybdenum, hafnium, tantalum, tungsten, lanthanum, cerium, neodymium, magnesium, calcium, strontium, barium, boron, silicon, germanium, and antimony. The element M included in the metal oxide is preferably one or more of the above elements, further preferably one or more selected from aluminum, gallium, tin, and yttrium, and still further preferably gallium. When the element M included in the metal oxide is gallium, the metal oxide in one embodiment of the present invention preferably includes one or more selected from indium, gallium, and zinc. In this specification and the like, a metal element and a metalloid element may be collectively referred to as a "metal element", and a "metal element" in this specification and the like may refer to a metalloid element.

As the metal oxide semiconductor in one embodiment of the present invention, for example, indium zinc oxide (In—Zn oxide), indium tin oxide (In—Sn oxide), indium titanium oxide (In—Ti oxide), indium gallium oxide (In—Ga oxide), indium gallium aluminum oxide (In—Ga—Al oxide), indium gallium tin oxide (also referred to as In—Ga—Sn oxide or IGTO), gallium zinc oxide (also referred to as Ga—Zn oxide or GZO), aluminum zinc oxide (also referred to as Al—Zn oxide or AZO), indium aluminum zinc oxide (also referred to as In—Al—Zn oxide or IAZO), indium tin zinc oxide (In—Sn—Zn oxide), indium titanium zinc oxide (In—Ti—Zn oxide), indium gallium zinc oxide (also referred to as In—Ga—Zn oxide or IGZO), indium gallium tin zinc oxide (also referred to as In—Ga—Sn—Zn oxide or IGZTO), or indium gallium aluminum zinc oxide (also referred to as In—Ga—Al—Zn oxide, IGAZO, or IAGZO) can be used. Alternatively, indium tin oxide containing silicon, gallium tin oxide (Ga—Sn oxide), aluminum tin oxide (Al—Sn oxide), or the like can be used.

By increasing the proportion of the number of indium atoms in the total number of atoms of all the metal elements contained in the metal oxide, the field-effect mobility of the transistor can be increased.

Note that the metal oxide may contain, instead of or in addition to In, one or more kinds selected from metal elements belonging to a period of a higher number in the periodic table. As the overlap between orbits of metal elements is larger, the metal oxide tends to have higher carrier conductivity. Thus, a transistor containing a metal element belonging to a period of a higher number in the periodic table can have high field-effect mobility in some cases. Examples of the metal element belonging to a period of a higher number in the periodic table include metal elements belonging to Period 5 and metal elements belonging to Period 6. Specific examples of the metal element include yttrium, zirconium, silver, cadmium, tin, antimony, barium, lead, bismuth, lanthanum, cerium, praseodymium, neodymium, promethium, samarium, and europium. Note that lanthanum, cerium, praseodymium, neodymium, promethium, samarium, and europium are called light rare-earth elements.

The metal oxide may contain one or more kinds selected from nonmetallic elements. A transistor including the metal oxide containing a nonmetallic element can have high field-effect mobility in some cases. Examples of the nonmetallic element include carbon, nitrogen, phosphorus, sulfur, selenium, fluorine, chlorine, bromine, and hydrogen.

By increasing the proportion of the number of zinc atoms in the total number of atoms of all the metal elements contained in the metal oxide, the metal oxide has high crystallinity, so that diffusion of impurities in the metal oxide can be inhibited. Consequently, a change in electrical characteristics of the transistor is suppressed and the transistor can have high reliability.

By increasing the proportion of the number of element M atoms in the total number of atoms of all the metal elements contained in the metal oxide, oxygen vacancies can be inhibited from being formed in the metal oxide. Accordingly, generation of carriers due to oxygen vacancies is inhibited, which makes the off-state current of the transistor low. Furthermore, a change in electrical characteristics of the transistor is suppressed and the transistor can have high reliability.

By increasing the proportion of the number of In atoms in the total number of atoms of all the metal elements contained in the metal oxide, a high on-state current and high frequency characteristics of the transistor can be achieved.

In the description of this embodiment, In—Ga—Zn oxide is sometimes taken as an example of the metal oxide.

For the formation of a metal oxide having the layered crystal structure, atomic layers are preferably deposited one by one. Since an ALD method is employed as the deposition method of a metal oxide in one embodiment of the present invention, a metal oxide having the layered crystal structure is easily formed.

Examples of the ALD method include a thermal ALD method, in which a precursor and a reactant react with each other only by a thermal energy, and a plasma-enhanced ALD (PEALD) method, in which a reactant excited by plasma is used.

An ALD method enables atomic layers to be deposited one by one, and has various advantages such as formation of an extremely thin film, deposition on a component with a high aspect ratio, formation of a film with few defects such as pinholes, deposition with excellent coverage, and low-temperature deposition. A PEALD method utilizing plasma is preferable, because deposition at lower temperature is possible in some cases. Note that some precursors used in the ALD method contain an element such as carbon or chlorine. Thus, a film formed by the ALD method sometimes contains an element such as carbon or chlorine in a larger quantity than a film formed by another deposition method. Note that these elements can be quantified by XPS or SIMS. The deposition method of a metal oxide in one embodiment of the present invention, which employs an ALD method and one or both of a deposition condition with a high substrate temperature and impurity removal treatment, might form a film with smaller amounts of carbon and chlorine than a method employing an ALD method and neither the condition nor the treatment.

Unlike in a deposition method in which particles ejected from a target or the like are deposited, in an ALD method, a film is formed by reaction at a surface of an object to be processed. Thus, an ALD method is a deposition method that is less likely to be influenced by the shape of an object to be processed and thus enables favorable step coverage. In particular, an ALD method enables excellent step coverage and excellent thickness uniformity, and thus is suitable for the case of covering a surface of an opening portion with a high aspect ratio, for example. On the other hand, an ALD method has a relatively low deposition rate; thus, it is sometimes preferable to combine an ALD method with another deposition method with a high deposition rate such as a sputtering method or a CVD method. For example, a method in which a sputtering method is used to deposit a first metal oxide, and an ALD method is used to deposit a second metal oxide over the first metal oxide can be given. For example, in the case where the first metal oxide has a crystal part, crystal growth occurs in the second metal oxide with the use of the crystal part as a nucleus.

When an ALD method is used, the composition of a film to be formed can be controlled with the amount of introduced source gases. For example, a film with a certain composition can be formed by adjusting the amount of introduced source gases, the number of times of introduction (also referred to as the number of pulses), and the time required for one pulse (also referred to as the pulse time) in an ALD method. Moreover, for example, when the source gas is changed during the deposition in an ALD method, a film whose composition is continuously changed can be formed. In the case where a film is formed while the source gas is changed, as compared with the case where a film is formed using a plurality of deposition chambers, the time taken for the deposition can be shortened because the time taken for transfer and pressure adjustment is omitted. Thus, memory devices can be manufactured with improved productivity in some cases.

[[Transistor Including Metal Oxide]]

Next, a transistor including a metal oxide (oxide semiconductor) will be described. Hereinafter, a transistor with a semiconductor layer of an oxide semiconductor is sometimes referred to as an OS transistor, and a transistor with a semiconductor layer of silicon is sometimes referred to as a Si transistor.

When the metal oxide (oxide semiconductor) of one embodiment of the present invention is used for a transistor, the transistor can have high field-effect mobility. In addition, the transistor can have high reliability. Furthermore, a miniaturized or highly integrated transistor can be achieved. For example, a transistor with a channel length of greater than or equal to 2 nm and less than or equal to 30 nm can be manufactured.

An oxide semiconductor having a low carrier concentration is preferably used for a channel formation region of the transistor. For example, the carrier concentration in the channel formation region of an oxide semiconductor is lower than or equal to $1\times 10^{18}$ cm$^{-3}$, preferably lower than or equal to $1\times 10^{17}$ cm$^{-3}$, further preferably lower than or equal to $1\times 10^{15}$ cm$^{-3}$, further preferably lower than or equal to $1\times 10^{13}$ cm$^{-3}$, still further preferably lower than or equal to $1\times 10^{11}$ cm$^{-3}$, yet further preferably lower than $1\times 10^{10}$ cm$^{-3}$, and higher than or equal to $1\times 10^{-9}$ cm$^{-3}$. In order to reduce the carrier concentration in an oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. A transistor whose channel formation region is formed in an oxide semiconductor having a high density of trap states has unstable electrical characteristics in some cases.

In order to obtain stable electrical characteristics of the transistor, it is effective to reduce the concentration of impurities in the oxide semiconductor. In order to reduce the impurity concentration in the oxide semiconductor, the impurity concentration in a film that is adjacent to the oxide semiconductor is preferably reduced. Examples of the impurity include hydrogen, carbon, and nitrogen. Note that impurities in an oxide semiconductor refer to, for example, elements other than the main components of the oxide semiconductor. For example, an element with a concentration of lower than 0.1 atomic % is an impurity.

The band gap of the oxide semiconductor is preferably larger than that of silicon (typically 1.1 eV), further preferably larger than or equal to 2 eV, still further preferably larger than or equal to 2.5 eV, yet still further preferably larger than or equal to 3.0 eV. With the use of an oxide semiconductor having a larger band gap than silicon, the off-state current (also referred to as Ioff) of the transistor can be reduced.

As miniaturization of a Si transistor progresses, a short-channel effect (also referred to as SCE) appears. Thus, a Si transistor is difficult to miniaturize. A factor that causes a short-channel effect is a small band gap of silicon. Meanwhile, an OS transistor uses an oxide semiconductor, which is a semiconductor material with a large band gap, and thus is less likely to suffer from a short-channel effect. In other words, a short-channel effect does not appear or hardly appears in an OS transistor.

Note that the short-channel effect refers to degradation of electrical characteristics which becomes obvious along with miniaturization of a transistor (a decrease in channel length). Specific examples of the short-channel effect include a decrease in threshold voltage, an increase in subthreshold swing value (sometime also referred to as S value), an increase in leakage current, and the like. Here, the S value means the amount of change in gate voltage in the subthreshold region when the drain voltage keeps constant and the drain current changes by one order of magnitude.

The characteristic length is widely used as an indicator of resistance to a short-channel effect. The characteristic length is an indicator of curving of potential in a channel formation region. As the characteristic length is shorter, the potential rises more sharply, which means that the resistance to a short-channel effect is high.

An OS transistor is an accumulation-type transistor, and a Si transistor is an inversion-type transistor. Thus, an OS transistor has a smaller characteristic length between a source region and a channel formation region and a smaller characteristic length between a drain region and the channel formation region than a Si transistor. Accordingly, an OS transistor has higher resistance to a short channel effect than a Si transistor. That is, in the case where a transistor with a short channel length needs to be manufactured, an OS transistor is more suitable than a Si transistor.

Even in the case where the carrier concentration in an oxide semiconductor is reduced until a channel formation region becomes an i-type or substantially i-type region, the conduction band minimum of the channel formation region of the transistor with a short channel length becomes low due to a conduction-band-lowering (CBL) effect; thus, the energy difference between the conduction band minimum of the channel formation region and that of the source region or the drain region might decrease to higher than or equal to 0.1 eV and lower than or equal to 0.2 eV. Accordingly, the OS transistor can be regarded as having an n+/n–/n+ accumulation-type junction-less transistor structure or an n+/n–/n+ accumulation-type non-junction transistor structure in which the channel formation region becomes an n$^-$-type region and the source region and the drain region become n$^+$-type regions in the OS transistor.

An OS transistor having the above structure enables a memory device to have favorable electrical characteristics even when the memory device is miniaturized or highly integrated. For example, the memory device can have favorable electrical characteristics even when the OS transistor has a channel length or gate length of less than or equal to 20 nm, less than or equal to 15 nm, less than or equal to 10 nm, less than or equal to 7 nm, or less than or equal to 6 nm and greater than or equal to 1 nm, greater than or equal to 3 nm, or greater than or equal to 5 nm. Meanwhile, it is sometimes difficult for a Si transistor to have a gate length less than or equal to 20 nm or less than or equal to 15 nm due to appearance of a short-channel effect. Thus, an OS transistor can be used as a transistor with a short channel length more suitably than a Si transistor. Note that the gate length refers to the length of a gate electrode in a direction in which carriers move inside a channel formation region during operation of the transistor.

Miniaturization of an OS transistor can improve the high frequency characteristics of the transistor. Specifically, the cutoff frequency of the transistor can be improved. In the case where the gate length of the OS transistor is within the above range, the cutoff frequency of the transistor can be higher than or equal to 50 GHz, preferably higher than or equal to 100 GHz, further preferably higher than or equal to 150 GHz at room temperature, for example.

As described above, an OS transistor has advantages over a Si transistor, such as a low off-state current and capability of having a short channel length.

[[Impurity in Metal Oxide]]

The influence of impurities in the metal oxide (oxide semiconductor) will be described here.

When an oxide semiconductor contains silicon or carbon, which is a Group 14 element, defect states are formed in the oxide semiconductor. Thus, the carbon concentration in the channel formation region of the oxide semiconductor, which is measured by SIMS, is lower than or equal to $1\times10^{20}$ atoms/cm$^3$, preferably lower than or equal to $5\times10^{19}$ atoms/cm$^3$, further preferably lower than or equal to $3\times10^{19}$ atoms/cm$^3$, further preferably lower than or equal to $1\times10^{19}$ atoms/cm$^3$, still further preferably lower than or equal to $3\times10^{18}$ atoms/cm$^3$, yet still further preferably lower than or equal to $1\times10^{18}$ atoms/cm$^3$. The silicon concentration in the channel formation region of the oxide semiconductor, which is measured by SIMS, is lower than or equal to $1\times10^{20}$ atoms/cm$^3$, preferably lower than or equal to $5\times10^{19}$ atoms/cm$^3$, further preferably lower than or equal to $3\times10^{19}$ atoms/cm$^3$, further preferably lower than or equal to $1\times10^{19}$ atoms/cm$^3$, still further preferably lower than or equal to $3\times10^{18}$ atoms/cm$^3$, yet still further preferably lower than or equal to $1\times10^{18}$ atoms/cm$^3$.

Furthermore, when the oxide semiconductor contains nitrogen, the oxide semiconductor easily becomes n-type by generation of electrons serving as carriers and an increase in carrier concentration. As a result, a transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the nitrogen concentration in the channel formation region of the oxide semiconductor, which is measured by SIMS, is lower than or equal to $1\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom generates an electron serving as a carrier. Thus, a transistor including an oxide semiconductor which contains hydrogen is likely to be normally on. For this reason, hydrogen in the channel formation region using the oxide semiconductor is preferably reduced as much as possible. Specifically, the hydrogen concentration in the channel formation region of the oxide semiconductor, which is measured by SIMS, is lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times 10^{18}$ atoms/cm$^3$.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to be normally-on. Thus, the concentration of an alkali metal or an alkaline earth metal in the channel formation region of the oxide semiconductor, which is measured by SIMS, is lower than or equal to $1\times10^{18}$ atoms/cm$^3$, preferably lower than or equal to $2\times10^{16}$ atoms/cm$^3$.

When an oxide semiconductor with sufficiently reduced impurities is used for a channel formation region in a transistor, the transistor can have stable electrical characteristics.

[Other Semiconductor Materials]

The oxide semiconductor 270 can be rephrased as a semiconductor layer including a channel formation region of a transistor. The semiconductor materials that can be used for the semiconductor layer are not limited to the above metal oxides. A semiconductor material which has a band gap (a semiconductor material that is not a zero-gap semiconductor) can be used for the semiconductor layer. For example, a single element semiconductor, a compound semiconductor, a layered material (also referred to as an atomic layered material or a two-dimensional material), or the like is preferably used as the semiconductor material.

In this specification and the like, the layered material is a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the single-element semiconductor that can be used as the semiconductor material include silicon and germanium. Examples of silicon that can be used for the semiconductor layer include single crystal silicon, polycrystalline silicon, microcrystalline silicon, and amorphous silicon. An example of polycrystalline silicon is low-temperature polysilicon (LTPS).

Examples of the compound semiconductor that can be used as the semiconductor material include silicon carbide, silicon germanium, gallium arsenide, indium phosphide, boron nitride, and boron arsenide. Boron nitride that can be used for the semiconductor layer preferably includes an amorphous structure. Boron nitride that can be used for the semiconductor layer preferably includes a crystal with a cubic structure.

Examples of the layered material include graphene, silicene, boron carbonitride, and chalcogenide. Boron carbonitride serving as the layered material contains carbon, nitrogen, and boron atoms arranged in a hexagonal lattice structure on a plane. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the semiconductor layer, a transition metal chalcogenide functioning as a semiconductor is preferably used, for example. Specific examples of the transition metal chalcogenide which can be used for the semiconductor layer include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$). The use of the transition metal chalcogenide for the semiconductor layer enables a memory device with a high on-state current to be provided.

With one embodiment of the present invention, a novel transistor, a novel semiconductor device, and a novel memory device can be provided. A memory device that can be miniaturized or highly integrated can be provided. A memory device with excellent frequency characteristics can be provided. A memory device that operates at high speed can be provided. A memory device with high reliability can be provided. A memory device with low power consumption can be provided. A memory device including a transistor with a high on-state current can be provided. A memory device with a small variation in transistor characteristics can be provided. A memory device with excellent electrical characteristics can be provided.

The configurations, structures, methods, and the like described in this embodiment can be used in an appropriate combination with any of the configurations, structures, methods, and the like described in the other embodiments and the like.

Embodiment 2

In this embodiment, a structure example of a memory device of one embodiment of the present invention will be described with reference to the drawings.

Figures 9A, 9B:
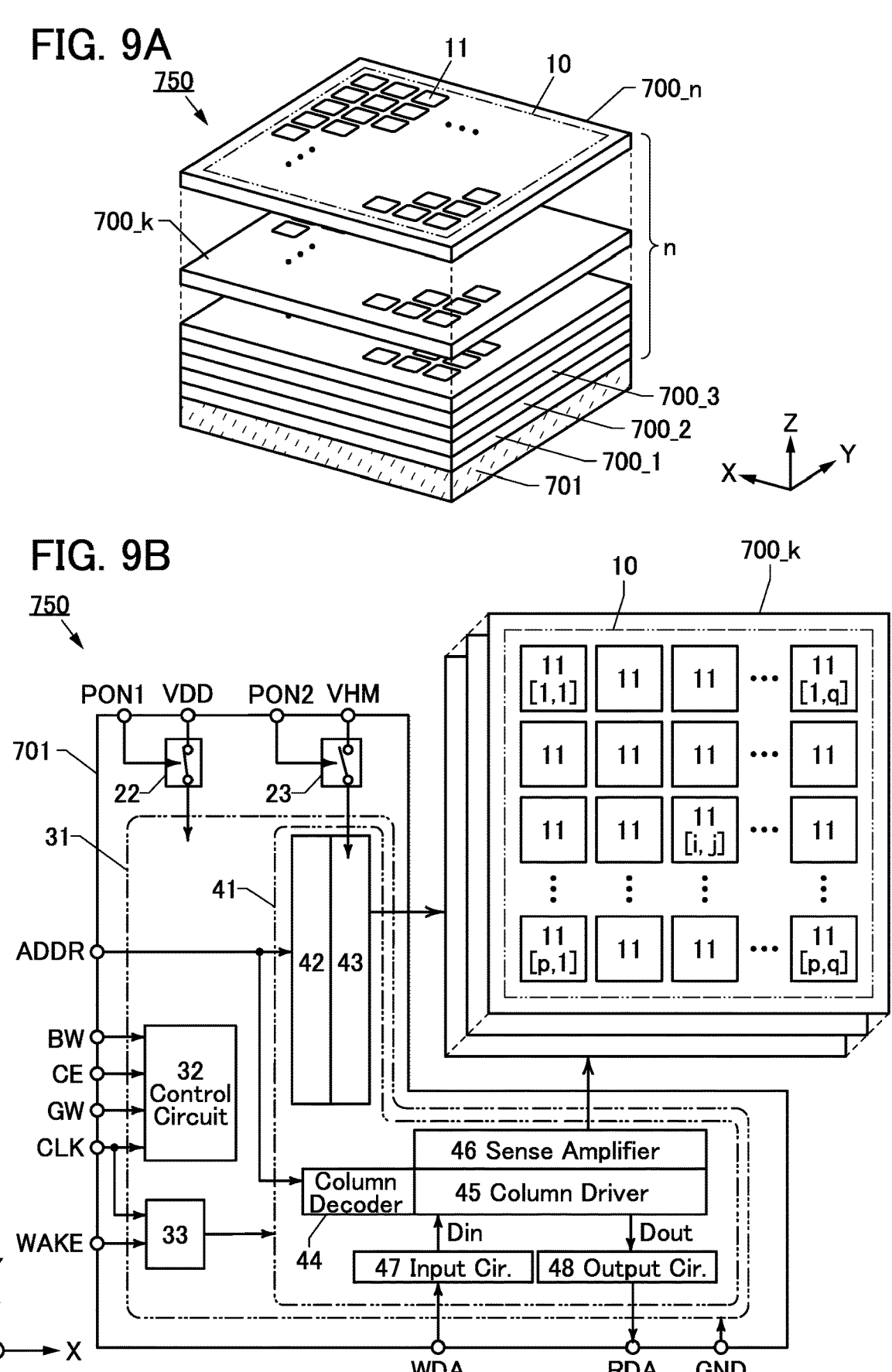
FIGS. 9A and 9B illustrate a structure example of a memory device.

FIG. 9A is a schematic perspective view of a memory device of one embodiment of the present invention. FIG. 9B is a block diagram of a memory device of one embodiment of the present invention.

A memory device 750 illustrated in FIGS. 9A and 9B includes a driver circuit layer 701 and n memory layers 700. The memory layers 700 each include a memory cell array 10. The memory cell array 10 includes a plurality of memory cells 11.

The n memory layers 700 are provided over the driver circuit layer 701. Provision of the n memory layers 700 over the driver circuit layer 701 can reduce the area occupied by the memory device 750. Furthermore, the storage capacity per unit area can be increased.

In this embodiment, the first memory layer 700 is denoted by a memory layer 700_1, the second memory layer 700 is denoted by a memory layer 700_2, and the third memory layer 700 is denoted by a memory layer 700_3. Furthermore, the k-th memory layer 700 (k is an integer greater than or equal to 1 and less than or equal to n) is denoted by a memory layer 700_k, and the n-th memory layer 700 is denoted by a memory layer 700_n. In this embodiment and the like, the "memory layer 700" is merely stated in some cases when describing a matter related to all the n memory layers 700 or showing a matter common to the n memory layers 700.

The driver circuit layer 701 includes a PSW 22 (power switch), a PSW 23, and a peripheral circuit 31. The peripheral circuit 31 includes a peripheral circuit 41, a control circuit 32, and a voltage generation circuit 33.

In the memory device 750, the circuits, signals, and voltages are selected and used as appropriate. Another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside.

The signal CLK is a clock signal. The signals BW, CE, and GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 32.

The control circuit 32 is a logic circuit having a function of controlling the entire operation of the memory device 750. For example, the control circuit performs a logical operation on the signals CE, GW, and BW to determine an operation mode (e.g., write operation or read operation) of the memory device 750. Alternatively, the control circuit 32 generates a control signal for the peripheral circuit 41 so that the operation mode is executed.

The voltage generation circuit 33 has a function of generating a negative voltage. The signal WAKE has a function of controlling the input of the signal CLK to the voltage generation circuit 33. For example, when an H-level signal is supplied as the signal WAKE, the signal CLK is input to the voltage generation circuit 33, and the voltage generation circuit 33 generates a negative voltage.

The peripheral circuit 41 is a circuit for writing and reading data to/from the memory cells 11. The peripheral circuit 41 includes a row decoder 42, a column decoder 44, a row driver 43, a column driver 45, an input circuit 47 (Input Cir.), an output circuit 48 (Output Cir.), and a sense amplifier 46.

The row decoder 42 and the column decoder 44 have a function of decoding the signal ADDR. The row decoder 42 is a circuit for specifying a row to be accessed, and the column decoder 44 is a circuit for specifying a column to be accessed. The row driver 43 has a function of selecting a wiring WWL (write word line) or a wiring RWL (read word line) specified by the row decoder 42. The column driver 45 has a function of writing data to the memory cells 11, a function of reading data from the memory cells 11, a function of retaining the read data, and the like. The column driver 45 has a function of selecting a wiring WBL (write bit line) and a wiring RBL (read bit line) specified by the column decoder 44.

The input circuit 47 has a function of retaining the signal WDA. Data retained by the input circuit 47 is output to the column driver 45. Data output from the input circuit 47 is data (Din) to be written to the memory cells 11. Data (Dout) read from the memory cells 11 by the column driver 45 is output to the output circuit 48. The output circuit 48 has a function of retaining Dout. In addition, the output circuit 48 has a function of outputting Dout to the outside of the memory device 750. Data output from the output circuit 48 is the signal RDA.

The PSW 22 has a function of controlling supply of VDD to the peripheral circuit 31. The PSW 23 has a function of controlling supply of VHM to the row driver 43. Here, in the memory device 750, a high power supply voltage is VDD and a low power supply voltage is GND (a ground potential). In addition, VHM is a high power supply voltage used to set a word line at a high level and is higher than VDD. The on/off of the PSW 22 is controlled by the signal PON1, and the on/off of the PSW 23 is controlled by the signal PON2. The number of power domains to which VDD is supplied is one in the peripheral circuit 31 in FIG. 9B but can be more than one. In this case, a power switch is provided for each power domain.

A structure example of each of the n memory layers 700 is described. The n memory layers 700 each include the memory cell array 10. The memory cell array 10 includes a plurality of memory cells 11. FIGS. 9A and 9B illustrate an example in which the memory cell array 10 includes the plurality of memory cells 11 arranged in a matrix of p rows and q columns (each of p and q is an integer greater than or equal to 2).

Note that the rows and the columns extend in directions orthogonal to each other. In this embodiment, the X direction is referred to as a "row" and the Y direction is referred to as a "column", but the X direction may be referred to as a "column" and the Y direction may be referred to as a "row".

In FIG. 9B, the memory cell 11 provided in the first row and the first column is denoted by a memory cell 11, and the memory cell 11 provided in the p-th row and the q-th column is denoted by a memory cell 11. Furthermore, the memory cell 11 provided in the i-th row and the j-th column (i is an integer greater than or equal to 1 and less than or equal to p, and j is an integer greater than or equal to 1 and less than or equal to q) is denoted by a memory cell 11.

As a circuit structure example of the memory cells 11, the structure described in the above embodiment (the memory cell 150) can be employed.

In the case where the memory layers 700 are stacked, it is preferable to arrange the wiring WBL and the wiring RBL in a direction perpendicular to the substrate surface. When the wiring WBL and the wiring RBL are provided in the direction perpendicular to the substrate surface, the signal propagation distance from the sense amplifier connected to the wiring WBL and the wiring RBL can be shortened and the resistance and parasitic capacitance of the wiring WBL and the wiring RBL can be significantly reduced. Thus, power consumption and signal delays can be reduced.

Figure 10A:
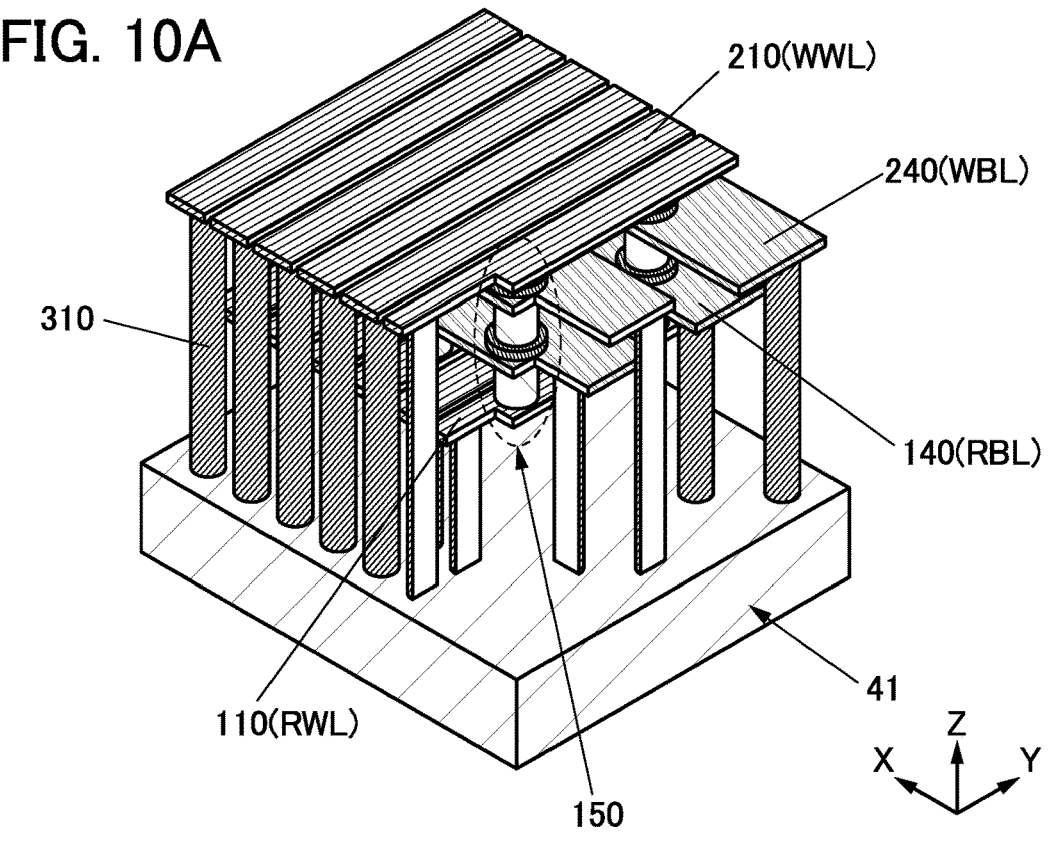
FIGS. 10A and 10B each illustrate a structure example of a memory device.
Figure 10B:
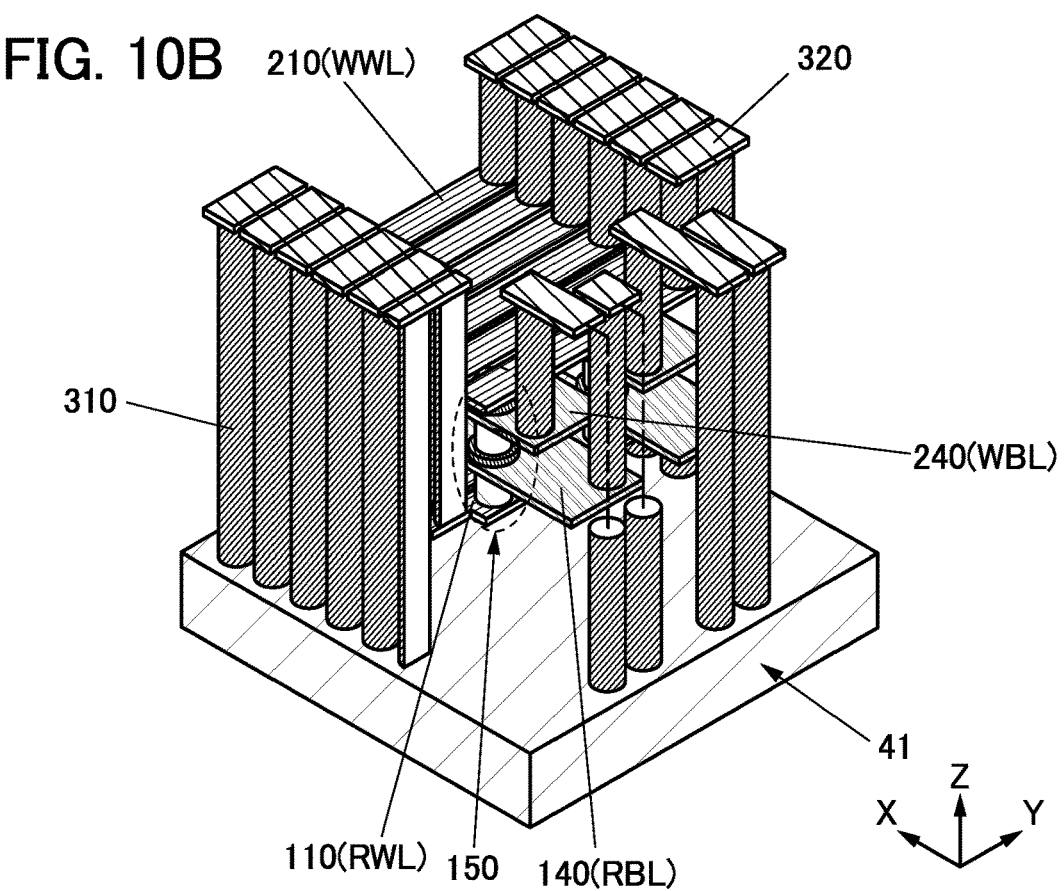

Note that the wiring 110 (RWL), the wiring 140 (RBL), the wiring 210 (WWL), and the wiring 240 (WBL) which are connected to the memory cell 150 in Embodiment 1 are electrically connected to the peripheral circuit 41 through plugs 310 as illustrated in FIGS. 10A and 10B.

FIGS. 10A and 10B each schematically illustrate a structure example of the case where the memory cell 150 described in Embodiment 1 is used in the memory cells 11 illustrated in FIGS. 9A and 9B. Like FIG. 1, FIGS. 10A and 10B omit illustration of insulators. Furthermore, in FIGS. 10A and 10B, some components are cut for clarity.

FIG. 10A illustrates a structure where the plug 310 are formed for each of the wirings; although the number of times the plug is formed is larger, the number of plugs can be smaller, so that the reduction of the area of the memory device is easy. FIG. 10B illustrates a structure where the wirings and the peripheral circuit 41 are electrically connected to each other through a wiring 320 in the uppermost layer and the plugs 310; although the number of plugs is larger, the plugs can be formed at once.

The configurations, structures, methods, and the like described in this embodiment can be used in an appropriate combination with any of the configurations, structures, methods, and the like described in the other embodiments and the like.

Embodiment 3

In this embodiment, an electronic component, an electronic device, a large computer, a device for space, and a data center (also referred to as DC) in which the memory device described in the above embodiments can be used will be described. An electronic component, an electronic device, a large computer, a device for space, and a data center in which the memory device of one embodiment of the present invention is used are effective in improving performance, e.g., reducing power consumption.

[Electronic Component]

Figure 11A:
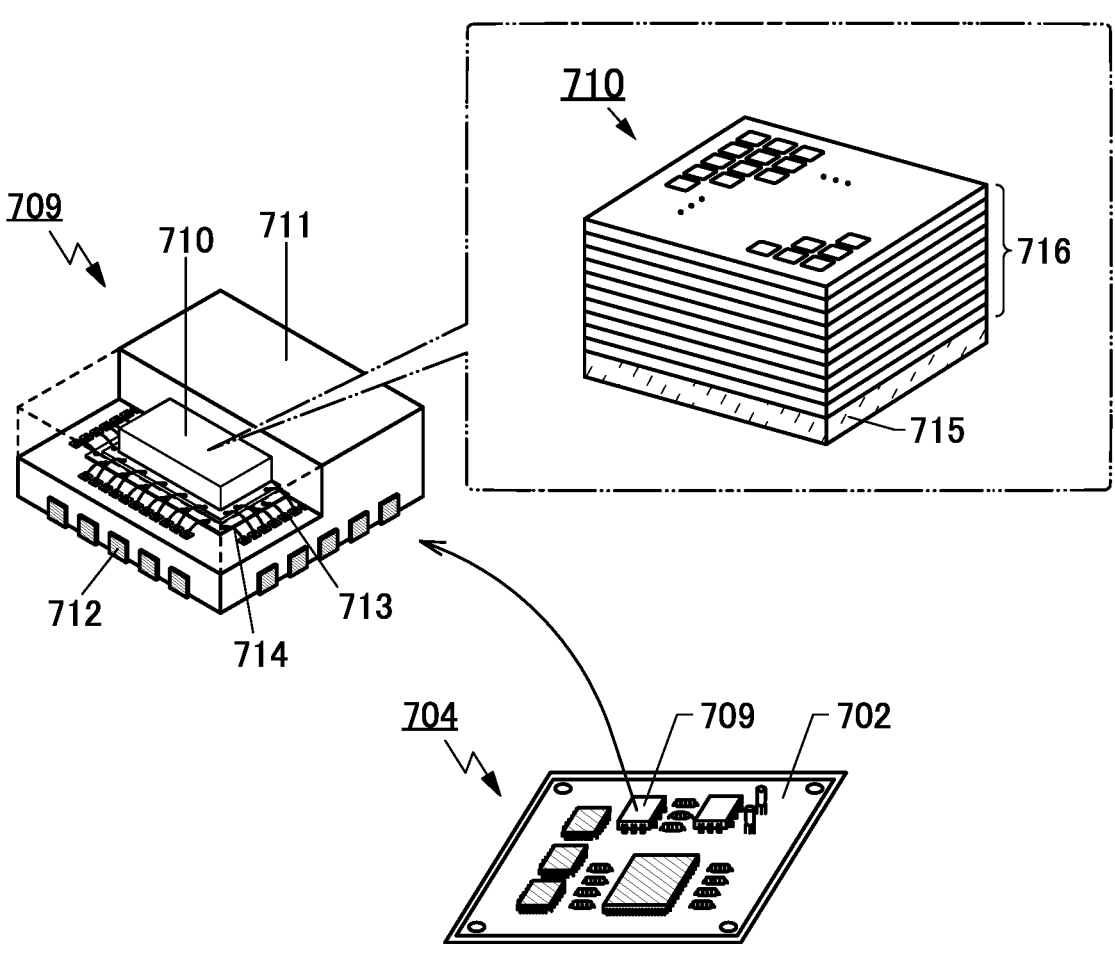
FIGS. 11A and 11B illustrate examples of electronic components.

FIG. 11A is a perspective view of a substrate (a circuit board 704) provided with an electronic component 709. The electronic component 709 illustrated in FIG. 11A includes a memory device 710 in a mold 711. Some components are omitted in FIG. 11A to show the inside of the electronic component 709. The electronic component 709 includes a land 712 outside the mold 711. The land 712 is electrically connected to an electrode pad 713, and the electrode pad 713 is electrically connected to the memory device 710 through a wire 714. The electronic component 709 is mounted on a printed circuit board 702, for example. A plurality of such electronic components are combined and electrically connected to each other on the printed circuit board 702, which forms the circuit board 704.

The memory device 710 includes a driver circuit layer 715 and a memory layer 716. The memory layer 716 has a structure in which a plurality of memory cell arrays are stacked. A stacked-layer structure of the driver circuit layer 715 and the memory layer 716 can be a monolithic stacked-layer structure. In the monolithic stacked-layer structure, layers can be connected without using through electrode technique such as through-silicon via (TSV) technique and bonding technique such as Cu—Cu direct bonding. The monolithic stacked-layer structure of the driver circuit layer 715 and the memory layer 716, enables, for example, what is called an on-chip memory structure in which a memory is directly formed on a processor. The on-chip memory structure allows an interface portion between the processor and the memory to operate at high speed.

With the on-chip memory structure, the sizes of a connection wiring and the like can be smaller than those in the case where the through electrode technique such as TSV is used, which means that the number of connection pins can be increased. The increase in the number of connection pins enables parallel operations, which can improve the bandwidth of the memory (also referred to as a memory bandwidth).

It is preferable that the plurality of memory cell arrays included in the memory layer 716 be formed with OS transistors and be monolithically stacked. The monolithic stacked-layer structure of memory cell arrays can improve the bandwidth of the memory and/or the access latency of the memory. Note that the bandwidth refers to the data transfer volume per unit time, and the access latency refers to a period of time from data access to the start of data transmission. Note that in the case where the memory layer 716 is formed with Si transistors, the monolithic stacked-layer structure is difficult to form compared with the case where the memory layer 716 is formed with OS transistors. Therefore, an OS transistor is superior to a Si transistor in the monolithic stacked-layer structure.

The memory device 710 may be called a die. Note that in this specification and the like, a die refers to a chip obtained by, for example, forming a circuit pattern on a disc-like substrate (also referred to as a wafer) or the like and cutting the substrate with the pattern into dices in a process of manufacturing a semiconductor chip. Examples of semiconductor materials that can be used for the die include silicon (Si), silicon carbide (SiC), and gallium nitride (GaN). For example, a die obtained from a silicon substrate (also referred to as a silicon wafer) is referred to as a silicon die in some cases.

Figure 11B:
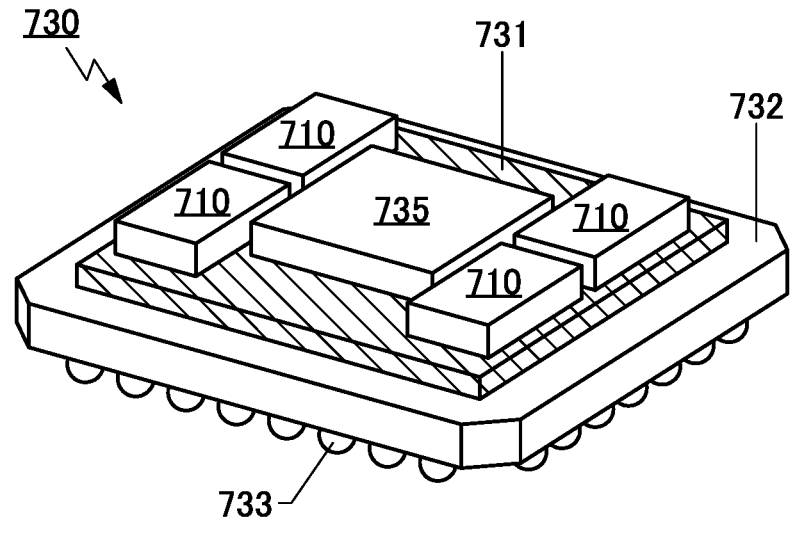

Next, FIG. 11B is a perspective view of an electronic component 730. The electronic component 730 is an example of a system in package (SiP) or a multi-chip module (MCM). In the electronic component 730, an interposer 731 is provided over a package substrate 732 (printed circuit board), and a semiconductor device 735 and a plurality of memory devices 710 are provided over the interposer 731.

The electronic component 730 using the memory device 710 as a high bandwidth memory (HBM) is illustrated as an example. As the memory device 735, an integrated circuit such as a central processing unit (CPU), a graphics processing unit (GPU), or an field programmable gate array (FPGA) can be used.

As the package substrate 732, a ceramic substrate, a plastic substrate, or a glass epoxy substrate can be used, for example. As the interposer 731, a silicon interposer or a resin interposer can be used, for example.

The interposer 731 includes a plurality of wirings and has a function of electrically connecting a plurality of integrated circuits with different terminal pitches. The plurality of wirings are provided in a single layer or multiple layers. In addition, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. Furthermore, a through electrode is provided in the interposer 731 and the through electrode is used to electrically connect an integrated circuit and the package substrate 732 in some cases. Moreover, in the case of using a silicon interposer, a TSV can also be used as the through electrode.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In the case where a plurality of integrated circuits with different terminal pitches are electrically connected with use of a silicon interposer, TSV, and the like, a space for a width of the terminal pitch and the like is needed. Accordingly, in the case where the size of the electronic component 730 is to be reduced, the width of the terminal pitch is an issue and it is sometimes difficult to provide a large number of wirings for obtaining a wide memory bandwidth. For this reason, the above-described monolithic stacked-layer structure with use of OS transistors is suitable. A composite structure combining memory cell arrays stacked using TSV and monolithically stacked memory cell arrays may be employed.

In addition, a heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the memory devices 710 and the semiconductor device 735 are preferably equal to each other.

To mount the electronic component 730 on another substrate, an electrode 733 may be provided on a bottom portion of the package substrate 732. FIG. 11B illustrates an example in which the electrode 733 is formed of a solder ball. Solder balls are provided in a matrix on the bottom portion of the package substrate 732, so that BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods other than BGA and PGA. Examples of a mounting method include SPGA (Staggered Pin Grid Array), LGA (Land Grid Array), QFP (Quad Flat Package), QFJ (Quad Flat J-leaded package), and QFN (Quad Flat Non-leaded package).

[Electronic Device]

Next, FIG. 12A is a perspective view of an electronic device 6500. The electronic device 6500 in FIG. 12A is a portable information terminal that can be used as a smartphone. The electronic device 6500 includes a housing 6501, a display portion 6502, a power button 6503, buttons 6504, a speaker 6505, a microphone 6506, a camera 6507, a light source 6508, a control device 6509, and the like. As the control device 6509, one or more selected from a CPU, a GPU, and a memory device are included, for example. The memory device of one embodiment of the present invention can be used for the display portion 6502, the control device 6509, and the like.

An electronic device 6600 illustrated in FIG. 12B is an information terminal that can be used as a laptop personal computer. The electronic device 6600 includes a housing 6611, a keyboard 6612, a pointing device 6613, an external connection port 6614, a display portion 6615, a control device 6616, and the like. As the control device 6616, one or more selected from a CPU, a GPU, and a memory device are included, for example. The memory device of one embodiment of the present invention can be used for the display portion 6615, the control device 6616, and the like. Note that the memory device of one embodiment of the present invention is preferably used for the control device 6509 and the control device 6616, in which case power consumption can be reduced.

[Large Computer]

Next, FIG. 12C is a perspective view of a large computer 5600. In the large computer 5600 illustrated in FIG. 12C, a plurality of rack mount computers 5620 are stored in a rack 5610. Note that the large computer 5600 may be referred to as a supercomputer.

The computer 5620 can have a structure in a perspective view illustrated in FIG. 12D, for example. In FIG. 12D, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

The PC card 5621 illustrated in FIG. 12E is an example of a processing board provided with a CPU, a GPU, a memory device, and the like. The PC card 5621 includes a board 5622. The board 5622 includes a connection terminal 5623, a connection terminal 5624, a connection terminal 5625, a semiconductor device 5626, a semiconductor device 5627, a semiconductor device 5628, and a connection terminal 5629. Although FIG. 12E also illustrates semiconductor devices other than the semiconductor devices 5626, 5627, and 5628, the following description of the semiconductor devices 5626, 5627, and 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminals 5623, 5624, and 5625 can serve as, for example, an interface for performing power supply, signal input, or the like to the PC card 5621. For another example, they can serve as an interface for outputting a signal calculated by the PC card 5621. Examples of the standard for each of the connection terminals 5623, 5624, and 5625 include USB (Universal Serial Bus), SATA (Serial ATA), and SCSI (Small Computer System Interface). In the case where video signals are output from the connection terminals 5623, 5624, and 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA, a GPU, and a CPU. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 709 can be used, for example.

The large computer 5600 can also function as a parallel computer. When the large computer 5600 is used as a parallel computer, large-scale computation necessary for artificial intelligence learning and inference can be performed, for example.

[Device for Space]

The memory device of one embodiment of the present invention can be suitably used as a device for space, such as devices processing and storing information.

The memory device of one embodiment of the present invention can include an OS transistor. A change in electrical characteristics of the OS transistor due to radiation irradiation is small. That is, the OS transistor is highly resistant to radiation, and thus can be suitably used even in an environment where radiation can enter. For example, the OS transistor can be suitably used in outer space.

Figure 13:
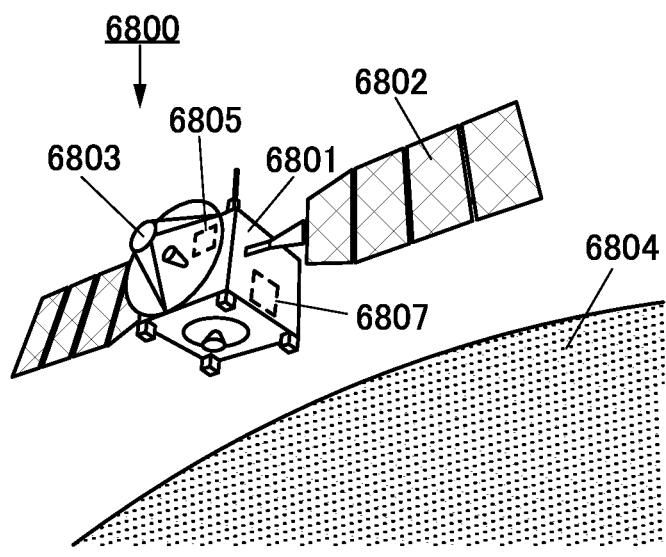
FIG. 13 illustrates an example of a device for space.

FIG. 13 illustrates an artificial satellite 6800 as an example of a device for space. The artificial satellite 6800 includes a body 6801, a solar panel 6802, an antenna 6803, a secondary battery 6805, and a control device 6807. In FIG. 13, a planet 6804 in outer space is illustrated. Note that outer space refers to, for example, space at an altitude greater than or equal to 100 km, and outer space described in this specification may also include thermosphere, mesosphere, and stratosphere.

Although not illustrated in FIG. 13, a battery management system (also referred to as BMS) or a battery control circuit may be provided in the secondary battery 6805. The OS transistor is preferably used in the battery management system or the battery control circuit because of its low power consumption and high reliability even in outer space.

The amount of radiation in outer space is more than 100 times that on the ground. Examples of radiation include electromagnetic waves (electromagnetic radiation) typified by X-rays and gamma rays and particle radiation typified by alpha rays, beta rays, neutron beam, proton beam, heavy-ion beams, and meson beams.

When the solar panel 6802 is irradiated with sunlight, electric power required for operation of the artificial satellite 6800 is generated. However, for example, in the situation where the solar panel is not irradiated with sunlight or the situation where the amount of sunlight with which the solar panel is irradiated is small, the amount of generated electric power is small. Accordingly, a sufficient amount of electric power required for operation of the artificial satellite 6800 might not be generated. In order to operate the artificial satellite 6800 even with a small amount of generated electric power, the artificial satellite 6800 is preferably provided with the secondary battery 6805. Note that a solar panel is referred to as a solar cell module in some cases.

The artificial satellite 6800 can generate a signal. The signal is transmitted through the antenna 6803, and can be received by a ground-based receiver or another artificial satellite, for example. When the signal transmitted by the artificial satellite 6800 is received, the position of a receiver that receives the signal can be measured. Thus, the artificial satellite 6800 can construct a satellite positioning system.

The control device 6807 has a function of controlling the artificial satellite 6800. The control device 6807 is formed with one or more selected from a CPU, a GPU, and a memory device, for example. The memory device of one embodiment of the present invention is suitably used for the control device 6807. A change in electrical characteristics of the OS transistor due to radiation irradiation is smaller than a change in electrical characteristics of a Si transistor. That is, the OS transistor has high reliability even in an environment where radiation can enter; thus, the OS transistor can be suitably used in such an environment.

The artificial satellite 6800 can include a sensor. For example, with a structure including a visible light sensor, the artificial satellite 6800 can have a function of sensing sunlight reflected by a ground-based object. Alternatively, with a structure including a thermal infrared sensor, the artificial satellite 6800 can have a function of sensing thermal infrared rays emitted from the surface of the earth. Thus, the artificial satellite 6800 can function as an earth observing satellite, for example.

Although the artificial satellite is described as an example of a device for space in this embodiment, one embodiment of the present invention is not limited to this example. The memory device of one embodiment of the present invention can be suitably used for a device for space such as a spacecraft, a space capsule, or a space probe, for example.

As described above, an OS transistor has excellent effects of achieving a wide memory bandwidth and being highly resistant to radiation as compared with a Si transistor.

[Data Center]

The memory device of one embodiment of the present invention can be suitably used for, for example, a storage system in a data center or the like. Long-term management of data, such as guarantee of data immutability, is required for the data center. In the case where data is managed for a long term, increasing the scale of the data center is necessary for installation of storages and servers for storing an enormous amount of data, stable power supply for data retention, cooling equipment for data retention, and the like.

With use of the memory device of one embodiment of the present invention for a storage system in a data center, electric power used for retaining data can be reduced and a memory device for retaining data can be reduced in size. Accordingly, reductions in sizes of the storage system and the power supply for retaining data, downscaling of the cooling equipment, and the like can be achieved. This can reduce the space of the data center.

Since the memory device of one embodiment of the present invention has low power consumption, heat generation from a circuit can be reduced. Accordingly, adverse effects of the heat generation on the circuit itself, the peripheral circuit, and the module can be reduced. Furthermore, the use of the memory device of one embodiment of the present invention can achieve a data center that operates stably even in a high temperature environment. Thus, the reliability of the data center can be increased.

Figure 14:
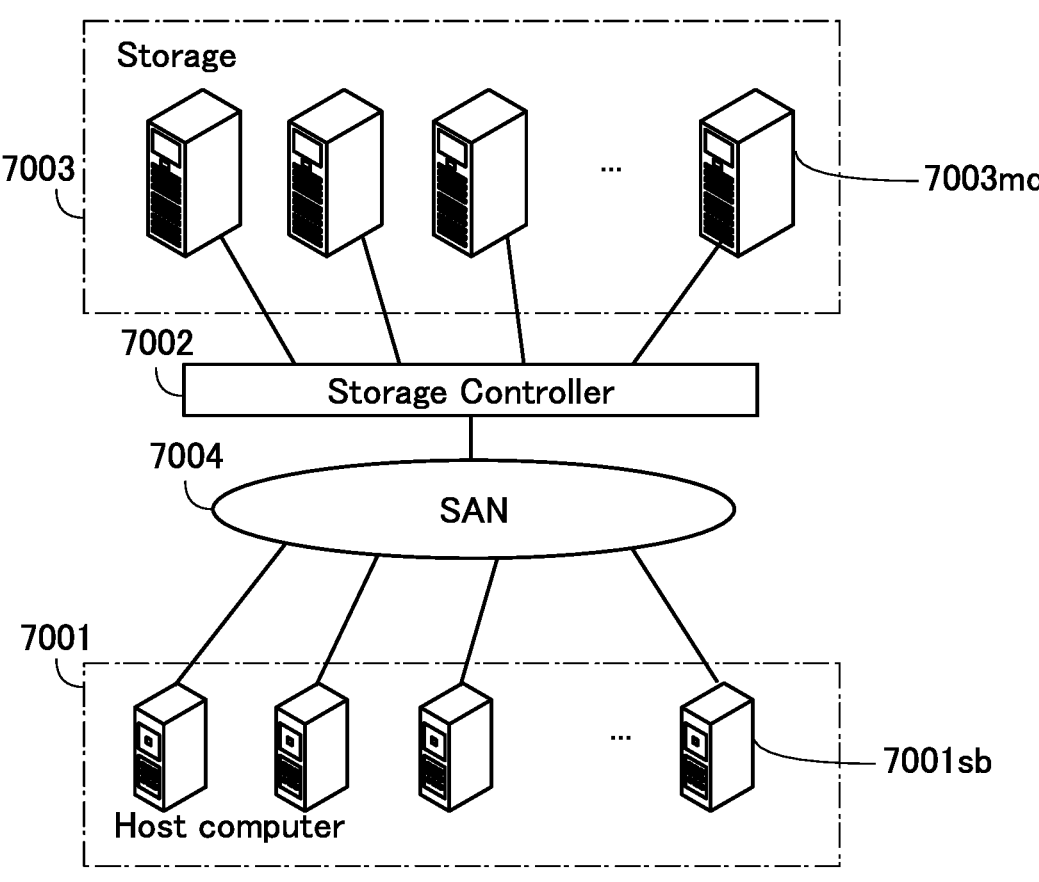
FIG. 14 illustrates an example of a storage system that can be used in a data center.

FIG. 14 illustrates a storage system that can be used in a data center. A storage system 7000 illustrated in FIG. 14 includes a plurality of servers 7001sb as a host 7001 (indicated as "Host Computer" in the diagram). The storage system 7000 includes a plurality of memory devices 7003md as a storage 7003 (indicated as "Storage" in the diagram). In the illustrated example, the host 7001 and the storage 7003 are connected to each other through a storage area network 7004 (indicated as "SAN" in the diagram) and a storage control circuit 7002 (indicated as "Storage Controller" in the diagram).

The host 7001 corresponds to a computer which accesses data stored in the storage 7003. The host 7001 may be connected to another host 700_1 through a network.

The data access speed, i.e., the time taken for storing and outputting data, of the storage 7003 is shortened by using a flash memory, but is still considerably longer than the data access speed of a DRAM that can be used as a cache memory in the storage 7003. In the storage system, in order to solve the problem of low access speed of the storage 7003, a cache memory is normally provided in the storage 7003 to shorten the time for data storage and output.

The above-described cache memory is used in the storage control circuit 7002 and the storage 7003. The data transmitted between the host 7001 and the storage 7003 is stored in the cache memories in the storage control circuit 7002 and the storage 7003 and then output to the host 7001 or the storage 7003.

With a configuration in which an OS transistor is used as a transistor for storing data in the cache memory to retain a potential based on data, the frequency of refreshing can be decreased, so that power consumption can be reduced. Furthermore, downscaling is possible by stacking memory cell arrays.

The use of the memory device of one embodiment of the present invention for one or more selected from an electronic component, an electronic device, a large computer, device for space, and a data center will produce an effect of reducing power consumption. Although demand for energy will increase with increasing performance and integration degree of memory devices, the use of the memory device of one embodiment of the present invention can thus reduce the emission amount of greenhouse gas typified by carbon dioxide ($CO_2$). The memory device of one embodiment of the present invention can be effectively used as one of the global warming countermeasures because of its low power consumption.

The configurations, structures, methods, and the like described in this embodiment can be used in an appropriate combination with any of the configurations, structures, methods, and the like described in the other embodiments and the like.

This application is based on Japanese Patent Application Serial No. 2022-172931 filed with Japan Patent Office on Oct. 28, 2022, the entire contents of which are hereby incorporated by reference.

What is claimed is:

1. A memory device comprising:
a plurality of memory cells placed in a staggered arrangement;
a first wiring;
a second wiring;
a third wiring; and
a fourth wiring,
wherein each of the plurality of memory cells comprises a first transistor and a second transistor,
wherein the second transistor is positioned above the first transistor,
wherein the first transistor comprises:
a first semiconductor comprising a region formed on a side surface of a first opening portion penetrating through the third wiring and a first insulator;
a second insulator being in contact with the first semiconductor and covering the first opening portion; and
a first conductor being in contact with the second insulator and embedded in the first opening portion,
wherein the first semiconductor comprises a region being in contact with the second wiring at a bottom portion of the first opening portion,
wherein the second transistor comprises:
a second semiconductor comprising a region formed on a side surface of a second opening portion penetrating through the fourth wiring and a third insulator;
a fourth insulator being in contact with the second semiconductor and covering the second opening portion; and
a second conductor being in contact with the fourth insulator and embedded in the second opening portion,
wherein the second semiconductor comprises a region being in contact with the first conductor at a bottom portion of the second opening portion,
wherein the first wiring is positioned over the second conductor,
wherein, when a diameter of a smallest circle comprising a shape in a top view of the first opening portion is D1 and a diameter of a smallest circle comprising a shape in a top view of the first conductor is D2, a width of the second wiring is greater than or equal to D1 and less than or equal to D2, and
wherein a width of the third wiring and a width of the fourth wiring are each greater than D2 and less than or equal to 2×D2.

2. The memory device according to claim 1, wherein, in the memory cells, a width of the first wiring and the width of the second wiring are substantially same as each other and the first wiring and the second wiring are substantially parallel with each other and overlap with each other.

3. The memory device according to claim 1, wherein, in the memory cells, the width of the third wiring and the width of the fourth wiring are substantially same as each other and the third wiring and the fourth wiring are substantially parallel with each other and overlap with each other.

4. The memory device according to claim 1, wherein the first wiring and the second wiring are substantially orthogonal to the third wiring and the fourth wiring.

5. The memory device according to claim 1, wherein the third wiring is positioned over the first insulator and the fourth wiring is positioned over the third insulator.

6. The memory device according to claim 1,
wherein the second wiring comprises a region functioning as one of a source electrode and a drain electrode of the first transistor,
wherein the third wiring comprises a region functioning as the other of the source electrode and the drain electrode of the first transistor,
wherein the first conductor has a function of a gate electrode of the first transistor and a function of one of a source electrode and a drain electrode of the second transistor, and
wherein the fourth wiring comprises a region functioning as the other of the source electrode and the drain electrode of the second transistor.

7. The memory device according to claim 1, wherein a diameter of the first opening portion and a diameter of the second opening portion are substantially same as each other and the first opening portion and the second opening portion overlap with each other.

8. The memory device according to claim 1, wherein the plurality of memory cells are placed in the staggered arrangement in two columns in a longitudinal direction of the third wiring and the fourth wiring.

9. The memory device according to claim 1, wherein a channel length is smaller than a channel width in each of the first transistor and the second transistor.

10. The memory device according to claim 1,
wherein each of the first semiconductor and the second semiconductor is an oxide semiconductor, and
wherein the oxide semiconductor comprises one or more selected form In, Ga, and Zn.

11. A memory device comprising:
a plurality of memory cells placed in a staggered arrangement;
a first wiring extending in a first direction;
a second wiring provided below the first wiring, the second wiring extending parallel with the first direction;
a third wiring provided over the second wiring and below the first wiring, the third wiring extending in a second direction being orthogonal to the first direction; and
a fourth wiring provided over the third wiring and below the first wiring, the fourth wiring extending parallel with the second direction,
wherein each of the plurality of memory cells comprises a first transistor and a second transistor stacked over the first transistor,
wherein the first transistor comprises:
the second wiring;
a first insulator over the second wiring;
the third wiring over the first insulator;
a first semiconductor comprising a part covering a first opening portion penetrating through the third wiring and the first insulator and reaching the second wiring;
a second insulator comprising a part provided over and in contact with the first semiconductor; and
a first conductor provided over and in contact with the part of the second insulator,
wherein the part of the first semiconductor comprises a region being in contact with the second wiring in the first opening portion, wherein the second transistor comprises:
the first conductor;
a third insulator over the first conductor;
the fourth wiring over the third insulator;
a second semiconductor comprising a part covering a second opening portion penetrating through the fourth wiring and the third insulator and reaching the first conductor;
a fourth insulator comprising a part provided over and in contact with the second semiconductor; and
a second conductor provided over and in contact with the part of the fourth insulator,
wherein the part of the second semiconductor comprises a region being in contact with the first conductor in the second opening portion,
wherein the first wiring is positioned over the second conductor, and
wherein, when a diameter of a smallest circle comprising a shape in a top view of the first conductor is D2, a width of the third wiring and a width of the fourth wiring are each greater than D2 and less than or equal to 2×D2.

12. The memory device according to claim 11,
wherein when a diameter of a smallest circle comprising a shape in a top view of the first opening portion is D1, D2 is greater than D1, and
wherein a width of the second wiring is greater than or equal to D1 and less than or equal to D2.

13. The memory device according to claim 11, wherein, in the memory cells, a width of the first wiring and the width of the second wiring are substantially same as each other and the first wiring and the second wiring overlap with each other.

14. The memory device according to claim 11, wherein, in the memory cells, the width of the third wiring and the width of the fourth wiring are substantially same as each other and the third wiring and the fourth wiring overlap with each other.

15. The memory device according to claim 11,
wherein the second wiring comprises a region configured to be one of a source electrode and a drain electrode of the first transistor,
wherein the third wiring comprises a region configured to be the other of the source electrode and the drain electrode of the first transistor,
wherein the first conductor is configured to be a gate electrode of the first transistor and one of a source electrode and a drain electrode of the second transistor, and
wherein the fourth wiring comprises a region configured to be the other of the source electrode and the drain electrode of the second transistor.

16. The memory device according to claim 11, wherein a diameter of the first opening portion and a diameter of the second opening portion are substantially same as each other and the first opening portion and the second opening portion overlap with each other.

17. The memory device according to claim 11, wherein the plurality of memory cells are placed in the staggered arrangement in two columns in the second direction.

18. The memory device according to claim 11, wherein a channel length is smaller than a channel width in each of the first transistor and the second transistor.

19. The memory device according to claim 11,
wherein each of the first semiconductor and the second semiconductor is an oxide semiconductor, and wherein the oxide semiconductor comprises one or more selected form In, Ga, and Zn.

* * * * *